(12) United States Patent
Huang et al.

(10) Patent No.: US 8,772,796 B2
(45) Date of Patent: Jul. 8, 2014

(54) PANEL AND METHOD FOR FABRICATING THE SAME

(75) Inventors: Kuo-Yu Huang, Hsin-Chu (TW); Te-Chun Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 122 days.

(21) Appl. No.: 13/483,005

(22) Filed: May 29, 2012

(65) Prior Publication Data

US 2013/0168704 A1 Jul. 4, 2013

(30) Foreign Application Priority Data

Dec. 30, 2011 (TW) .............................. 100149961 A

(51) Int. Cl.
*H01L 29/18* (2006.01)
*H01L 27/12* (2006.01)
*H01L 27/15* (2006.01)

(52) U.S. Cl.
CPC ......... *H01L 27/1248* (2013.01); *H01L 27/1255* (2013.01); *H01L 27/124* (2013.01); *H01L 27/1288* (2013.01); *H01L 27/156* (2013.01)
USPC ..................................... 257/88; 257/E27.121

(58) Field of Classification Search
CPC ............ H01L 27/1248; H01L 27/1255; H01L 27/124; H01L 27/1288; H01L 27/156
USPC ................................................. 257/E27.121
See application file for complete search history.

(56) References Cited

U.S. PATENT DOCUMENTS

| | | | |
|---|---|---|---|
| 6,143,602 A | 11/2000 | Jang | |
| 7,599,015 B2 * | 10/2009 | Lee et al. | 349/43 |
| 7,656,479 B2 * | 2/2010 | Lin et al. | 349/113 |
| 7,839,462 B2 | 11/2010 | Lin | |
| 7,928,450 B2 * | 4/2011 | Lin et al. | 257/83 |
| 7,932,521 B2 * | 4/2011 | Akimoto et al. | 257/72 |
| 2005/0134779 A1 | 6/2005 | Park | |
| 2006/0108585 A1 * | 5/2006 | Gan et al. | 257/66 |
| 2010/0301345 A1 | 12/2010 | Lin | |
| 2012/0113346 A1 * | 5/2012 | Choi et al. | 349/43 |

FOREIGN PATENT DOCUMENTS

| | | |
|---|---|---|
| TW | 395054 | 6/2000 |
| TW | 201042345 | 12/2010 |
| TW | I342456 | 5/2011 |
| TW | I346390 | 8/2011 |

\* cited by examiner

*Primary Examiner* — Kimberly Rizkallah
*Assistant Examiner* — Alexander Belousov
(74) *Attorney, Agent, or Firm* — Winston Hsu; Scott Margo

(57) ABSTRACT

A panel is disclosed, in which, a patterned semiconductor layer is formed on an insulation layer. The patterned semiconductor layer includes a portion corresponding to an electrode and another portion corresponding to a wiring trace. The portion corresponding to the electrode may be formed as, for example, a channel, and the other portion corresponding to the wiring trace may protect the wiring trace during fabrication process or in the structure from scratching or corrosion.

18 Claims, 17 Drawing Sheets

PANEL AND METHOD FOR FABRICATING THE SAME

BACKGROUND OF THE DISCLOSURE

1. Field of the Disclosure

The document relates to a panel and a method for fabricating the same, and particularly to a fabrication method during which wiring traces can be protected and a panel fabricated by the method.

2. Description of the Prior Art

In a fabrication process for display, with the development of high resolution and slim border for the small and medium size panel of thin film transistor liquid crystal display (TFT-LCD), the number of the photolithography-and-etching process (PEP) is increased for improvement of the aperture ratio of the pixel and slim border properties of the TFT display panel. However, in a mass production, a bottleneck occurs due to the numerous photolithography-and-etching processes. Moreover, more defects are likely generated, causing a low yield, as more processing procedures are performed.

Accordingly, there is still a need for a novel panel and the fabricating method of the panel to reduce the mask number used in the fabrication so as to have a convenient process and defect reduction for yield improvement.

SUMMARY OF THE DISCLOSURE

According to an objective of the disclosure, a panel according to an exemplary embodiment is provided. The panel includes a substrate, a first patterned conductive layer, a first insulation layer, a second patterned conductive layer, a second insulation layer, a patterned semiconductor layer, a third patterned conductive layer, a protection layer, and a patterned conductive film. The substrate is defined with a pixel region and a wiring region on at least one side of the pixel region. The first patterned conductive layer is disposed on the substrate. The first patterned conductive layer includes at least one first electrode line, at least one first electrode, and at least one wiring trace. The first electrode and the first electrode line are connected to each other and both disposed in the pixel region. The wiring trace is disposed in the wiring region. The first insulation layer is disposed to cover the pixel region, the wiring region, and the first patterned conductive layer. The second patterned conductive layer is disposed on the first insulation layer. The second patterned conductive layer includes at least one second electrode which is disposed on the first insulation layer in the pixel region. The second insulation layer is disposed to cover the second electrode in the pixel region, the wiring region, and the first insulation layer above the wiring trace. The patterned semiconductor layer is disposed on the second insulation layer. The patterned semiconductor layer includes at least one first portion corresponding to the first electrode and at least one second portion corresponding to the wiring trace. The third patterned conductive layer is disposed on the second insulation layer. The third patterned conductive layer includes at least one second electrode line, at least one third electrode connected to the second electrode line, and at least one fourth electrode. The third electrode, the second electrode line, and the fourth electrode are disposed in the pixel region. The first electrode, the first portion of the patterned semiconductor layer, and the third electrode are disposed to form a transistor. The fourth electrode and the second electrode are correspondingly disposed to form a storage capacitor. The protection layer is disposed to cover the third patterned conductive layer and the second insulation layer in the pixel region. The patterned conductive film is disposed on the protection layer in the pixel region. The patterned conductive film includes at least one pixel electrode which is connected to the transistor and the storage capacitor.

According to an objective of the disclosure, a method of fabricating a panel according to an exemplary embodiment is provided. The method of fabricating a panel includes steps as follows. First, a substrate is provided. The substrate is defined with a pixel region and a wiring region on at least one side of the pixel region. Next, a first patterned conductive layer is formed on the substrate. The first patterned conductive layer includes at least one first electrode line, a first electrode connected to the at least one first electrode line, and at least one wiring trace. The first electrode and the first electrode line are disposed in the pixel region. The wiring trace is disposed in the wiring region. A first insulation layer is formed to cover the pixel region, the wiring region, and the first patterned conductive layer. A second patterned conductive layer is formed on the first insulation layer. The second patterned conductive layer includes at least one second electrode disposed on the first insulation layer in the pixel region. A second insulation layer is formed and covers the second electrode in the pixel region, the wiring region, and the first insulation layer above the wiring trace. A patterned semiconductor layer is formed on the second insulation layer. The patterned semiconductor layer includes at least one first portion corresponding to the first electrode and at least one second portion corresponding to the wiring trace. A third patterned conductive layer is formed on the second insulation layer. The third patterned conductive layer includes at least one second electrode line, at least one third electrode connected to the second electrode line, and at least one fourth electrode. The third electrode, the second electrode line, and the fourth electrode are disposed in the pixel region. The first electrode, the first portion of the patterned semiconductor layer, and the third electrode are disposed to form a transistor. The fourth electrode and the second electrode are correspondingly disposed to form a storage capacitor. A protection layer is formed and covers the third patterned conductive layer and the second insulation layer in the pixel region. A patterned conductive film is formed on the protection layer in the pixel region. The patterned conductive film includes at least one pixel electrode connected to the transistor and the storage capacitor.

These and other objectives of the disclosure will no doubt become obvious to those of ordinary skill in the art after reading the following detailed description of the exemplary embodiment that is illustrated in the various figures and drawings.

DETAILED DESCRIPTION

To provide a better understanding of the disclosure to the skilled person in the technical field of the disclosure, exemplary embodiments will be detailed as follows. The exemplary embodiments of the disclosure are illustrated in the accompanying drawings with numbered elements to elaborate the contents and effects to be achieved. It should be noted that the drawings serve only for illustration purposes and are not drawn to scale. Similar elements in the embodiments may be referred with same numbers.

Figure 1:
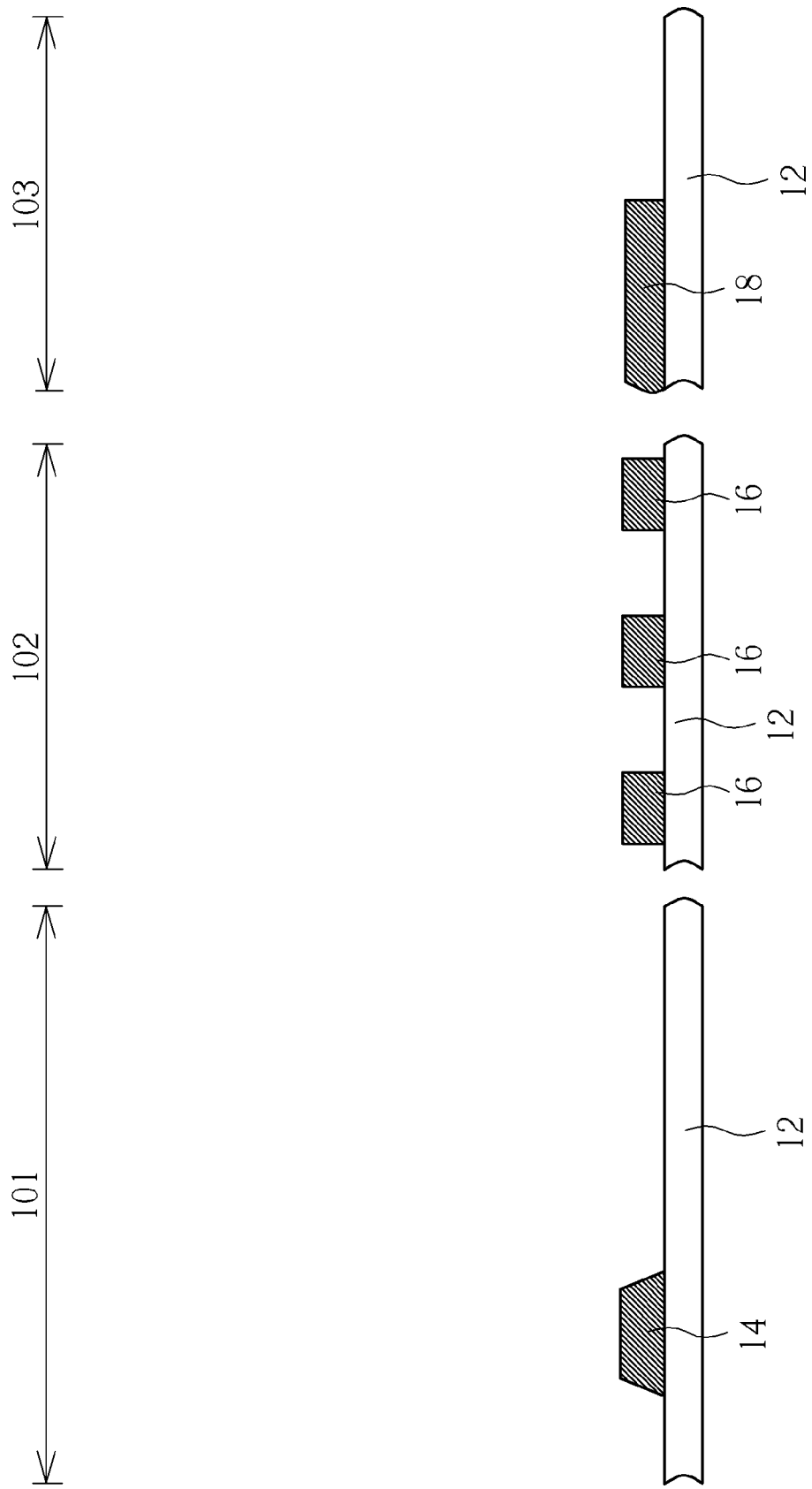
FIGS. 1-7 are schematic cross-sectional views illustrating a method of fabricating a panel according to one exemplary embodiment of the disclosure.

Please refer to FIGS. 1-7, which are schematic views illustrating a method of fabricating a panel according to one exemplary embodiment of the disclosure. In addition, in the embodiments of the disclosure, the panel including pixel structure, wiring trace, and outer lead bonding pad is selected as examples to illustrate the application of the disclosure; the disclosure, however, is not limited thereto and may be applied to various types of panels or display panels. As shown in FIG. 1, first, a substrate 12 is provided. The substrate may include glass, ceramic, wafer, metal, polymer, flexible material, or other suitable material. The substrate 12 is defined with a pixel region 101, a wiring region 102 on at least one side of the pixel region 101, and a contact pad region 103. The term "at least one side" means one, two, three, four, or more sides. The wiring region 102 and the contact pad region 103 are located outside of the pixel region. The aforesaid two regions 102 and 103 are not within a pixel region, so as not for disposing thereon wiring traces such as data lines, scan lines, storage capacitor lines, or power supply lines. A first conductive layer is formed on the substrate 12. The first conductive layer may be a single layer or a multi-layer. The first conductive layer may include reflective material or transparent material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The transparent material may include one such as indium tin oxide, indium gallium oxide, indium zinc oxide, aluminum zinc oxide, or other suitable material. Thereafter, a first photolithography-and-etching process (PEP) is performed to pattern the first conductive layer to form a first patterned conductive layer, which may include a first electrode 14, a first electrode line connected to the first electrode 14, and at least one wiring trace 16, on the substrate 12. Certainly, in other embodiments, the first patterned conductive layer may be formed using a process such as a screen printing process, an ink injection process, or other suitable process. The first electrode 14 and the first electrode line are both disposed in the pixel region 101, the wiring trace 16 is disposed in the wiring region 102. The first patterned conductive layer may further include a contact pad 18 which is disposed on the contact pad region 103. The contact pad 18 may be connected to the wiring trace 16. The first electrode 14 may be, for example, a gate. The first electrode line may be for example a gate line, but not limited thereto, and connected to the gate. The wiring trace 16 may be employed for connecting a contact pad and an element or device, such as the first electrode line which may be a gate line (or referred to as scan line), a source line, a storage capacitor line, a power supply line, a common electrode, and the like, in the pixel region 101 for delivering signal. The connection may be achieved through "bridging" if it is necessary.

Figure 2:
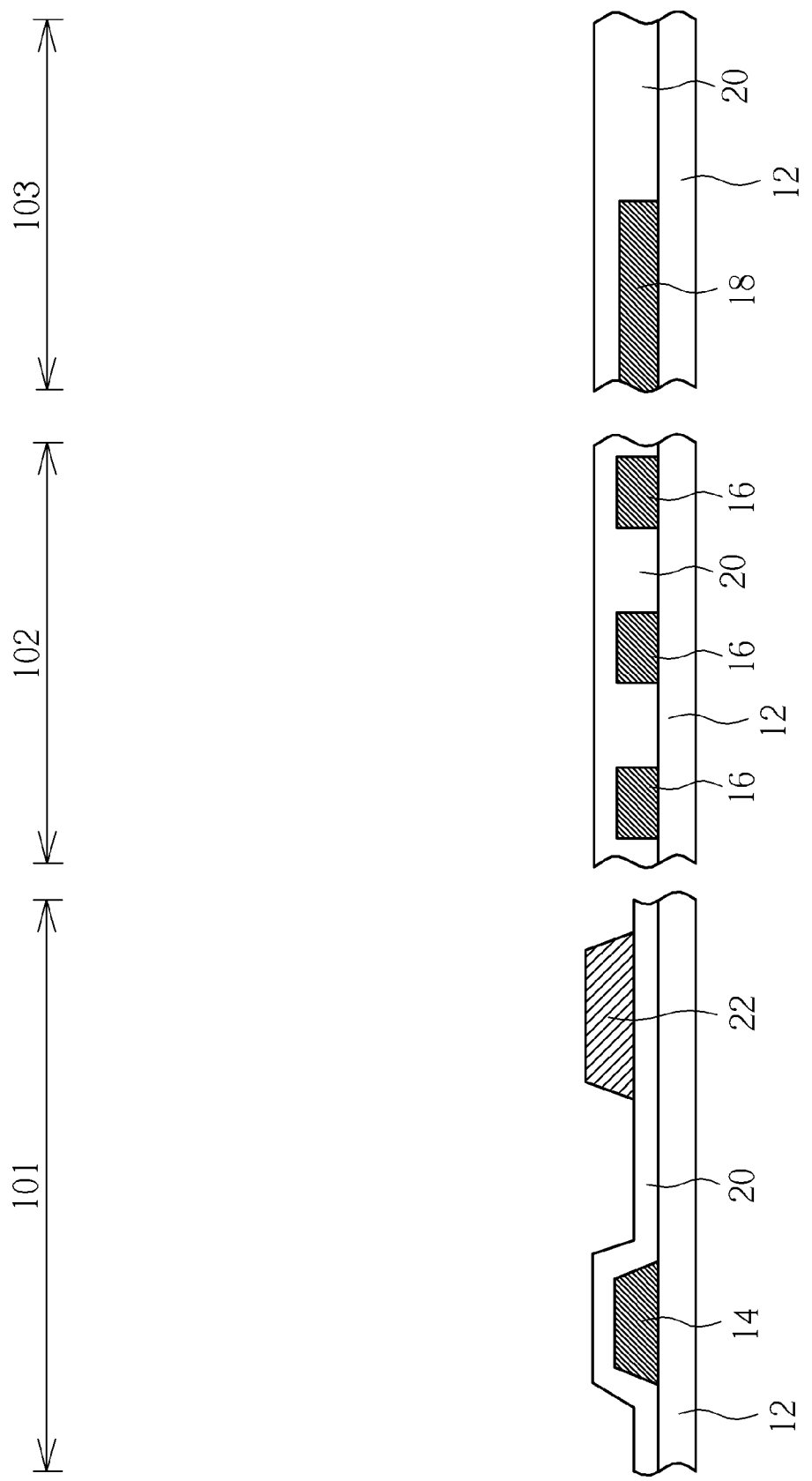

Thereafter, as shown in FIG. 2, a first insulation layer 20 is formed. It covers the pixel region 101, the wiring region 102, and the first patterned conductive layer, i.e. being on the first electrode 14 and the wiring trace 16. It may also cover the contact pad region 103 and the contact pad 18 of the first patterned conductive layer. The first insulation layer 20 may be a single layer or a multi-layer, and it may include material such as inorganic material, organic material, or a combination thereof. The inorganic material may include material such as silicon nitride, silicon oxide, silicon oxynitride, silicon carbide, or other suitable material. The organic material may include material such as polyacrylates, polyimides (PI), polycarbonates (PC), benzocyclobutene (BCB), poly(ether sulfones) (PES), or other suitable material, or a derivative of the aforesaid material. The schematic drawings show that the first insulation layer 20 on the contact pad region 103 has a flat surface; while, practically, the surface may be planar, approximately planar or not planar. The thickness of the first insulation layer 20 may be, for example, about 2400 angstroms, but not limited thereto, depending on various designs. Thereafter, a second conductive layer is formed on the first insulation layer 20 and the second conductive layer may be a single layer or a multi-layer. The second conductive layer may include a reflective material or transparent material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The transparent material may include one such as indium tin oxide, indium gallium oxide, indium zinc oxide, aluminum zinc oxide, or other suitable material. Thereafter, a second PEP is performed to pattern the second conductive layer to form a second patterned conductive layer, which may include a second electrode 22 located on the first insulation layer 20 in the pixel region 101. Certainly, in other embodiments, the second patterned conductive layer may be formed using a process such as a screen printing process, an ink injection process, or other suitable process. The second electrode 22 may be for example a portion of a storage capacitor line (also referred to as a common electrode line or a storage capacitor lower electrode).

Figure 3:
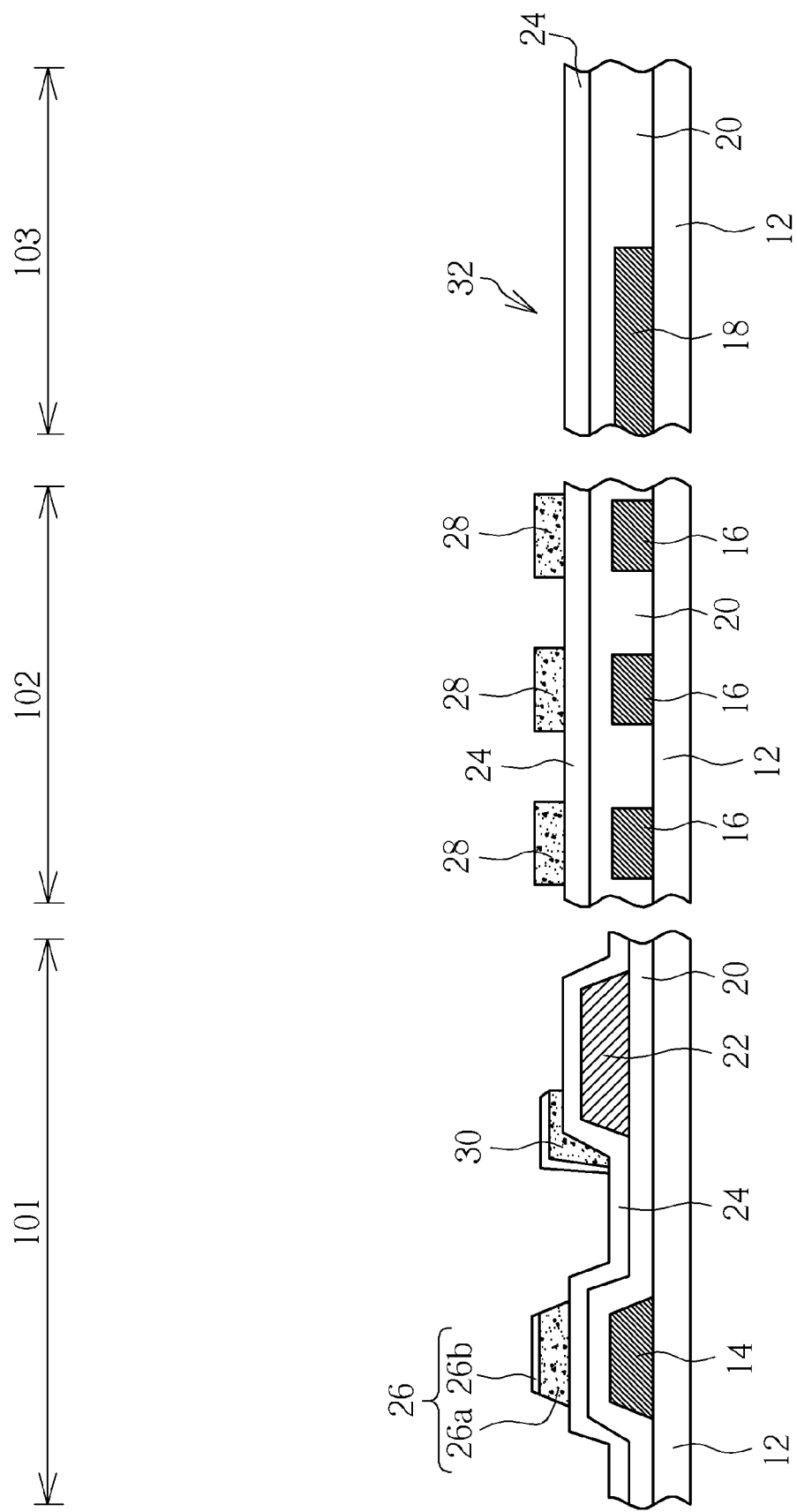

Thereafter, referring to FIG. 3, a second insulation layer 24 is formed to cover the second electrode 22 in the pixel region 101, the wiring region 102, and the first insulation layer 20 above the wiring trace 16. The second insulation layer 24 and the first insulation layer 20 may together cover the contact pad region 103. Thereafter, a semiconductor layer is formed on the second insulation layer 24. A third PEP is performed to partly remove the semiconductor layer to form a patterned semiconductor layer. The patterned semiconductor layer is allowed to include one portion 26 corresponding to the first electrode 14 and at least one portion 28 corresponding to the wiring trace 16. That is, the portion 16 is located right above the first electrode 14 and may serve as a channel. The at least one portion 28 is located right above the wiring trace 16 and may protect the underlying wiring trace 16 during later processes. The patterned semiconductor layer may be a single layer or a multi-layer, and it may include material such as amorphous silicon, monocrystalline silicon, polycrystalline silicon, microcrystalline silicon, oxide semiconductor material, or other suitable material, or organic semiconductor material. In addition, in other embodiments, the patterned semiconductor layer may be formed through a screen printing process, an ink injection process, or other suitable process. In this embodiment, a heavily-doped layer may be included at the surface of the patterned semiconductor layer. The heavily-doped layer may be formed through an implantation process performed on the surface with a heavy concentration of dopant, or through a deposition of semiconductor material with a heavy concentration of dopant together on the surface. Accordingly, the portion 26 may include a semiconductor channel layer 26a and a heavily-doped semiconductor layer (or referred to as an ohmic contact layer) 26b. The patterned semiconductor layer may include another portion 30 covering one edge of the second electrode 22 at the side facing the first electrode 14. The portion 30 also may provide a protection function during later processes. In other embodiments, the patterned semiconductor layer may include a channel region and a doped region. The channel region is an intrinsic region corresponding to the first electrode 14. The doped region is a heavily-doped region or a lightly-doped region, or includes both of them.

Figure 4:
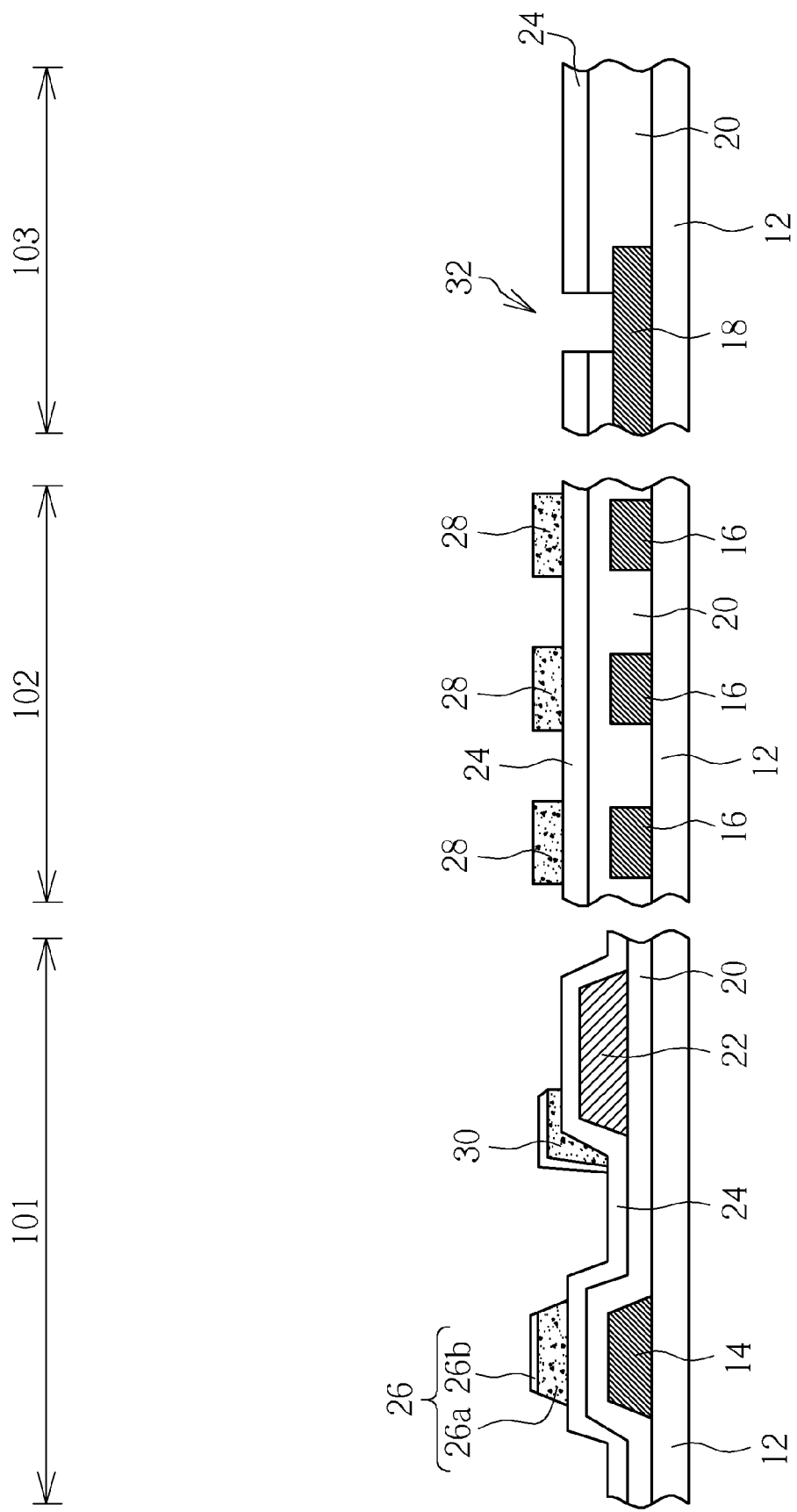

Thereafter, referring to FIG. 4, a fourth PEP is performed to etch the second insulation layer 24 to form an opening and to etch the first insulation layer 20 through this opening to form at least one opening 32 to expose a portion of the contact pad 18. That is, the opening 32 passes through the first insulation layer 20 and the second insulation layer 24 in the contact pad region 103, and a portion of the contact pad 18 in the contact pad region 103 is exposed.

Figure 5:
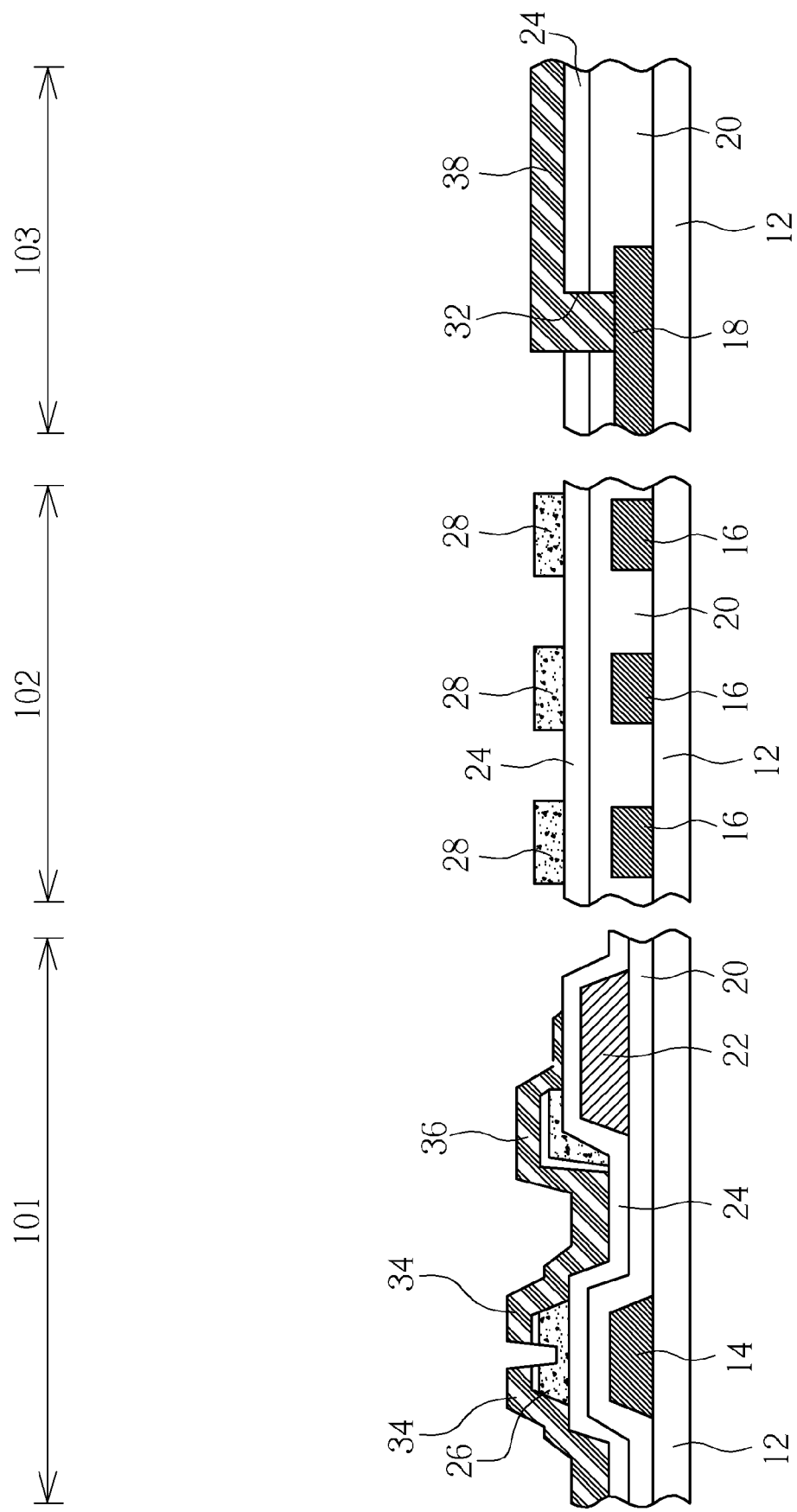

Thereafter, referring to FIG. 5, a third conductive layer is formed on the second insulation layer 24 and the patterned semiconductor layer and fills the opening 32 so as to contact the contact pad 18. The third conductive layer may be a single layer or a multi-layer. The third conductive layer may include a reflective material or transparent material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The transparent material may include one such as indium tin oxide, indium gallium oxide, indium zinc oxide, aluminum zinc oxide, or other suitable material. Thereafter, a fifth PEP is performed to pattern the third conductive layer to form a third patterned conductive layer, which may include a second electrode line (not shown), a third electrode 34 connected to the second electrode line, and a fourth electrode 36. The third electrode 34, the second electrode line, and the fourth electrode 36 are disposed in the pixel region 101. The first electrode 14, the portion 26 of the patterned semiconductor layer, and the third electrode 34 are made in a way to form a transistor. The fourth electrode 36 and the second electrode 22, which may be, for example, a portion of a storage capacitor line, may be disposed to overlap with each other, with the second insulation layer 24 placed therebetween to form a storage capacitor. In the embodiment as shown in FIG. 5, the third electrode 34 may include a source and a drain apart from each other. This drain may be connected or not connected to the fourth electrode 36. That is, the third electrode 34 and the fourth electrode 36 may be or be not connected to each other. The second electrode line may be connected to the third electrode 34 such as a source, and accordingly the second electrode line may be a data line. The third patterned conductive layer may further include a contact pad 38 disposed on the second insulation layer 24 in the contact pad region 103 and contact the contact pad 18 through an opening, such as the opening 32, within the second insulation layer 24. In addition, in other embodiments, the third patterned conductive layer may be formed using a process such as a screen printing process, an ink injection process, or other suitable process.

Figure 6:
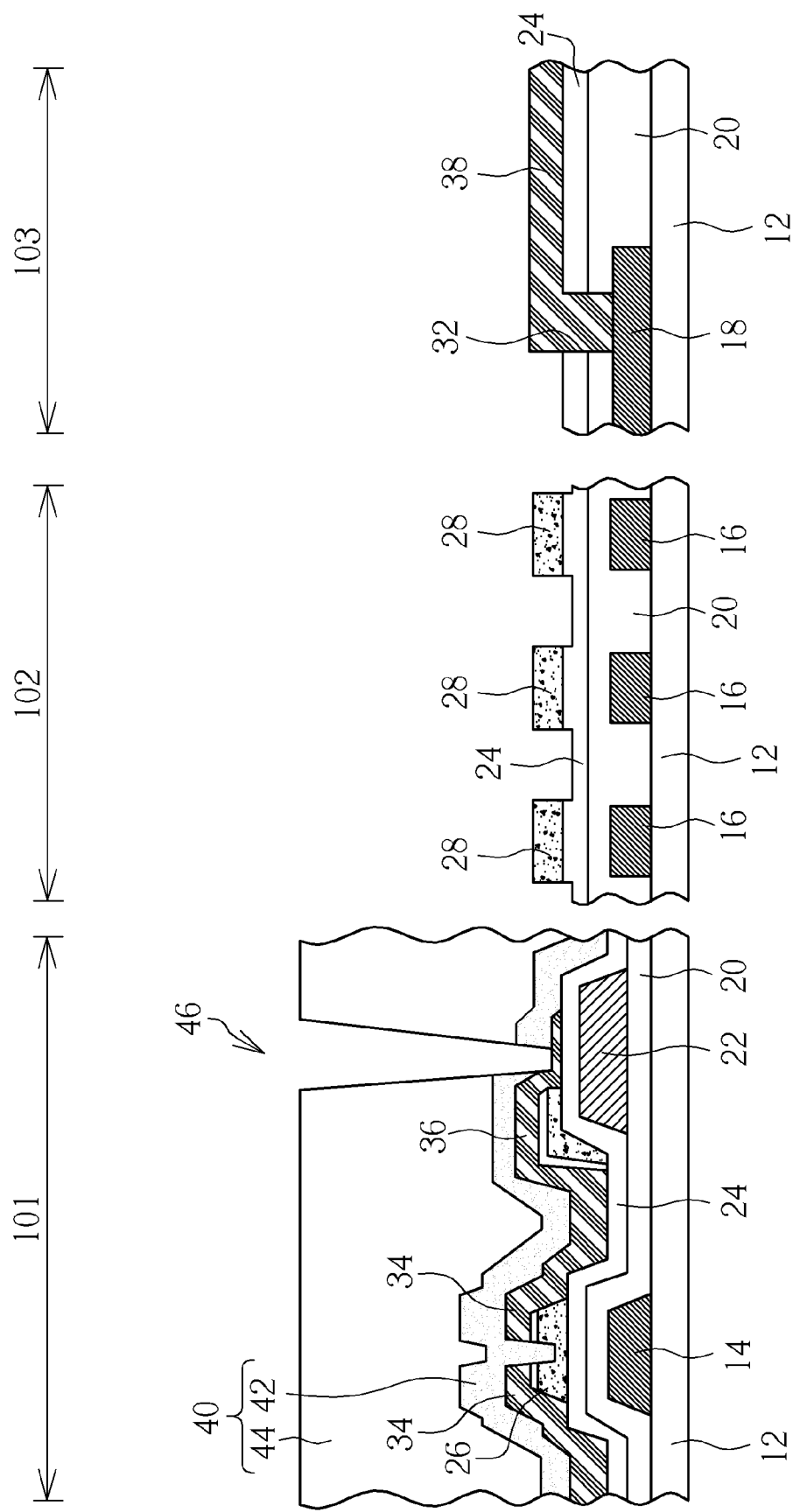

Thereafter, referring to FIG. 6, a protection layer 40 is formed on the second insulation layer 24, the patterned semiconductor layer including the exposed portions 26 and 28, the third electrode 34 and the fourth electrode 36.

The protection layer 40 may be formed as follows. First, a passivation layer 42 is formed to cover the third patterned conductive layer or entirely cover the pixel region 101, the wiring region 102, and the contact pad region 103. Thereafter, a photosensitive organic layer 44 is formed on and covers the passivation layer 42. The photosensitive organic layer 44 may serve as a planar layer. The passivation layer 42 may include insulation material such as silicon nitride, silicon oxynitride, or silicon oxide. Its thickness may be, for example, about 2000 to about 3000 angstroms. The photosensitive organic layer 44 may include organic material such as photo resist material. Its thickness may be, for example, about 4.2 to about 4.8 micrometers. The stack structure of the passivation layer 42 and the photosensitive organic layer 44 serves as the protection layer 40. Thereafter, a sixth PEP is performed to pattern the photosensitive organic layer 44 to form an opening within the photosensitive organic layer 44 to expose portions of the passivation layer 42 above the transistor and the storage capacitor and to remove the photosensitive organic layer 44 in the wiring region 102 and the contact pad region 103. Thereafter, the passivation layer 42 not covered with the photosensitive organic layer 44 is etched away, forming a contact window 46 exposing a portion of the storage capacitor. During the etch process, the portions 28 of the patterned semiconductor layer protect the underlying wiring traces 16. In one embodiment, the protection layer 40 only covers the third patterned conductive layer and the second insulation layer 24 in the pixel region 101 subsequently and does not remain in the wiring region 102. In other embodiments, the protection layer 40 may only include the photosensitive organic layer 44 or the passivation layer 42.

Figure 7:
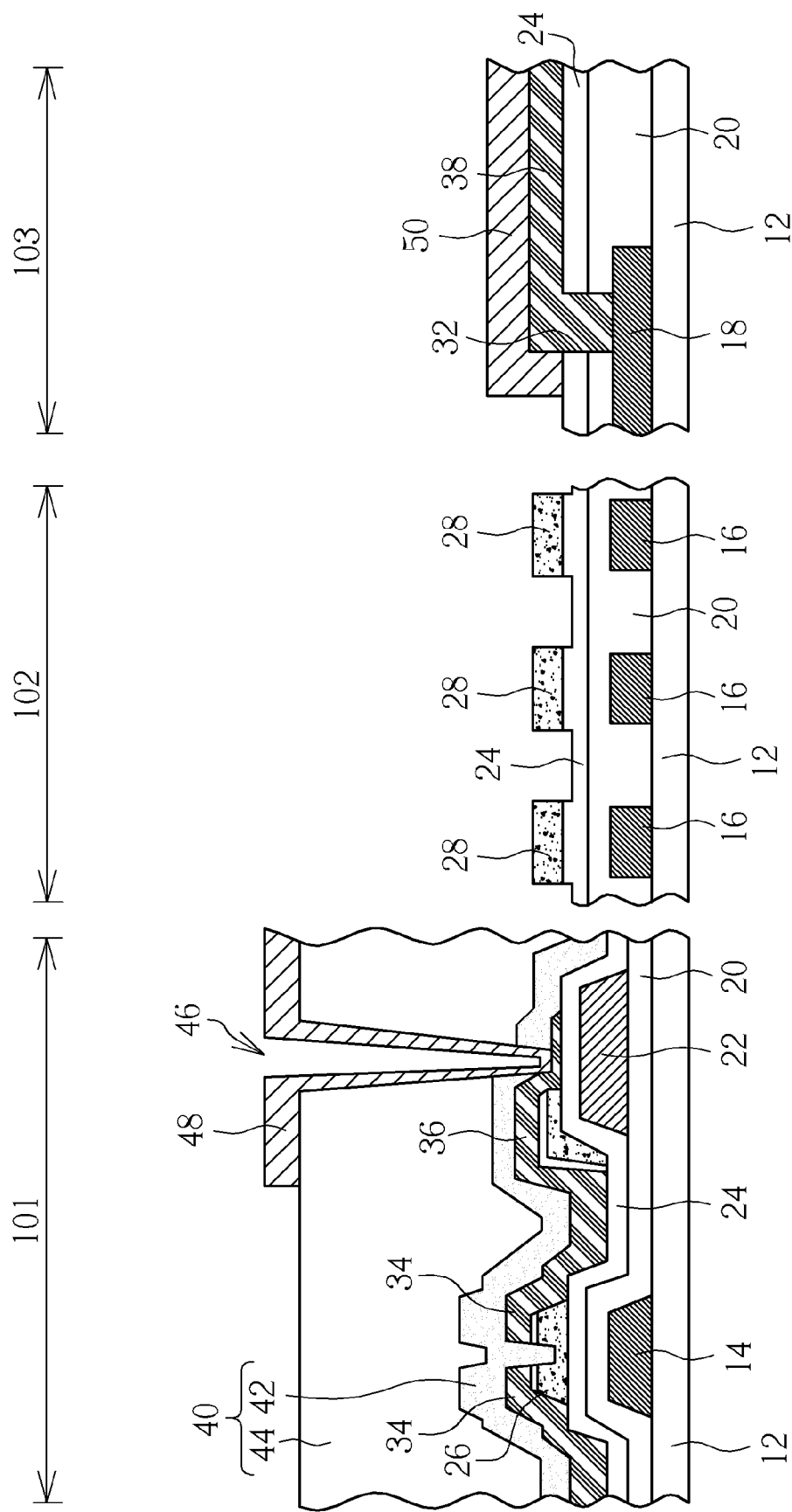

Thereafter, referring to FIG. 7, a conductive film is formed in the pixel region 101, the wiring region 102 and the contact pad region 103. The conductive film may be a single layer or a multi-layer and may include transparent material, reflective material, or a combination thereof. The transparent material may include one such as indium tin oxide (ITO), indium zinc oxide (IZO), cadmium tin oxide (CTO), aluminum zinc oxide (AZO), indium tin zinc oxide (ITZO), or other suitable material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The thickness of the conductive film may be, for example, about 750 angstroms. A seventh PEP is performed to form a patterned conductive film, which may include a pixel electrode 48 disposed above the protection layer 40 and a portion 50 in the contact pad region 103 apart from the pixel electrode 48. The portion 50 covers the contact pad 38 and may protect the contact pad 38. In FIG. 7, the patterned conductive film does not cover the wiring trace 16. The pixel electrode 48 is also formed on the sidewall and the bottom of the contact window 46 and contacts the fourth electrode 36 to be electrically connected to each other. Accordingly, when the fourth electrode 36 is a member of a storage capacitor, the pixel electrode 48 is electrically connected to the storage capacitor; while, when the fourth electrode 36 also connects with a portion (such as a drain) of the third electrode 34, the pixel electrode 48 is also electrically connected to a transistor which includes the portion of the third electrode 34 as a member. When the fourth electrode 36 is not connected to the third electrode 34, another contact window may be formed in the protection layer 40, if desired, to allow the pixel electrode 40 and the portion of the third electrode 34 are electrically connected to each other. In other embodiments, the patterned conductive film may be formed using a process such as a screen printing process, an ink injection process, or other suitable process.

Please refer to FIGS. 8-14, which are schematic views illustrating a method of fabricating a panel according to another exemplary embodiment of the disclosure. In this embodiment, first, a substrate 12 is provided. The substrate 12 is defined with a pixel region 201, a wiring region 202 on at least one side of the pixel region 201, and contact pad regions 203 and 204. Elements, such as thin film transistor and others, in the pixel region 201 may be made using processes the same as or similar to the processes used for making the elements in the pixel region 101 in the aforesaid embodiment. While, in the wiring region 202, the first conductive layer and the second conductive layer as mentioned in the aforesaid embodiment are utilized, in this exemplary embodiment, to form wiring traces having a two-layered structure in which the wiring traces of the upper layer and the wiring traces of the lower layer are alternately disposed with respect to each other, so as to reduce the width of the wiring region, which, in turn, to reduce the border width of the display panel. A patterned semiconductor layer is also disposed above the wiring traces of the upper layer for protection function. In the contact pad regions, there are two types of layout for contact pads due to the alternate placement of the upper wiring traces and the lower wiring traces. The contact pad in the contact pad region 203 may be made using processes the same as or similar to the processes used for making the contact pad in the contact pad region 103.

Figure 8:
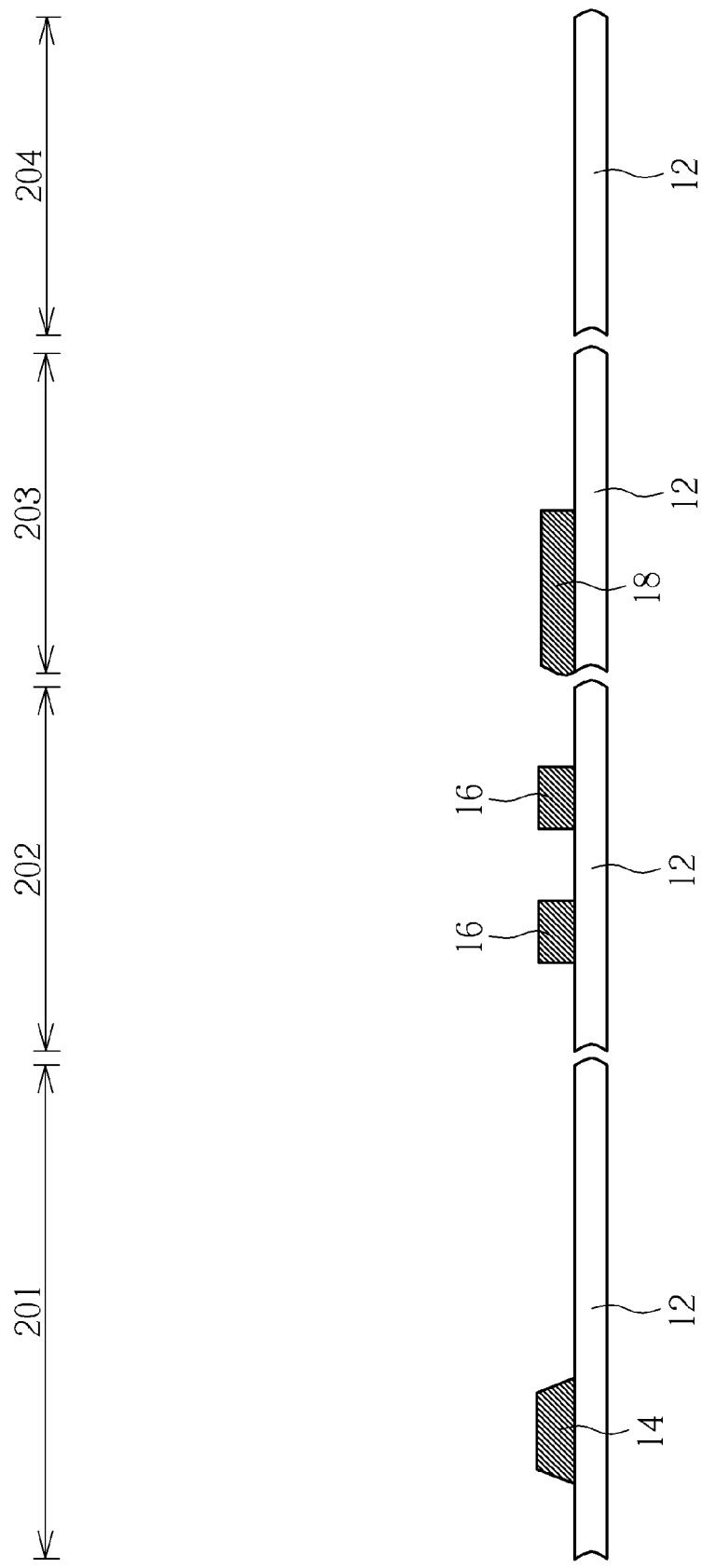
FIGS. 8-14 are schematic cross-sectional views illustrating a method of fabricating a panel according to another exemplary embodiment of the disclosure.

Referring to FIG. 8, a first conductive layer is formed on the substrate 12. The first conductive layer may be a single layer or a multi-layer. The first conductive layer may include reflective material or transparent material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The transparent material may include one such as indium tin oxide, indium gallium oxide, indium zinc oxide, aluminum zinc oxide, or other suitable material. Thereafter, a first PEP is performed to pattern the first conductive layer to form a first patterned conductive layer on the substrate 12. The first patterned conductive layer may include a first electrode 14 in the pixel region 201, a first electrode line connected to the first electrode 14, and a plurality of wiring traces 16 in the wiring region 202. The first patterned conductive layer may further include a contact pad 18 disposed in the contact pad region 203. The contact pad 18 may be connected to the wiring trace 16, but not limited thereto. Certainly, in other embodiments, the first patterned conductive layer may be formed using a process such as a screen printing process, an ink injection process, or other suitable process.

Figure 9:
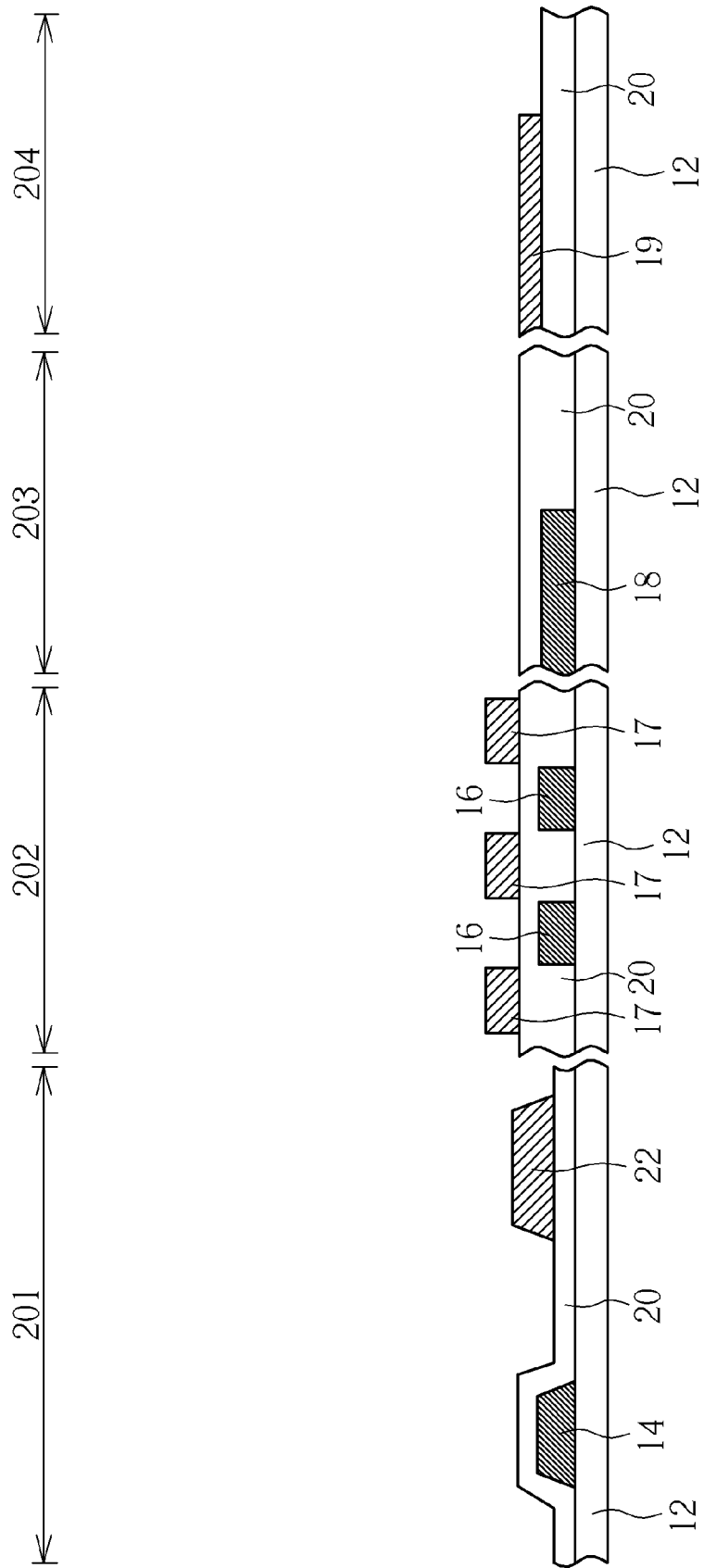

Thereafter, as shown in FIG. 9, a first insulation layer 20 is formed. It covers the pixel region 201, the wiring region 202, and the first patterned conductive layer, such as the first electrode 14 and the wiring traces 16. It may also cover the contact pad region 203 and the contact pad 18. The first insulation layer 20 may be a single layer or a multi-layer, and it may include material such as inorganic material, organic material, or a combination thereof. The inorganic material may include material such as silicon nitride, silicon oxide, silicon oxynitride, silicon carbide, or other suitable material. The organic material may include material such as polyacrylates, polyimides (PI), polycarbonates (PC), benzocyclobutene (BCB), poly(ethersulfones) (PES), or other suitable material, or a derivative of the aforesaid material. Thereafter, a second conductive layer is formed on the first insulation layer 20 and may be a single layer or a multi-layer. The second conductive layer may include a reflective material or transparent material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The transparent material may include one such as indium tin oxide, indium gallium oxide, indium zinc oxide, aluminum zinc oxide, or other suitable material. Thereafter, a second PEP is performed to pattern the second conductive layer to form a second patterned conductive layer, which may include a second electrode 22 located on the first insulation layer 20 in the pixel region 201 and a plurality of wiring traces 17 located on the second insulation layer 20 in the wiring region 202. Certainly, in other embodiments, the second patterned conductive layer may be formed using a process such as a screen printing process, an ink injection process, or other suitable process. In addition, the second patterned conductive layer may further include a contact pad 19 on the first insulation layer 20 in the contact pad region 204. The contact pad 19 may be connected to the wiring trace 17, but not limited thereto. The wiring traces 16 and 17 may be employed for connecting contact pads and elements or devices, such as the first electrode line which may be a gate line (or referred to as scan line), a source line, a storage capacitor line, a power supply line, a common electrode, and the like, in the pixel region 201 for delivering signal. The connection may be achieved through "bridging" if it is necessary.

Figure 10:
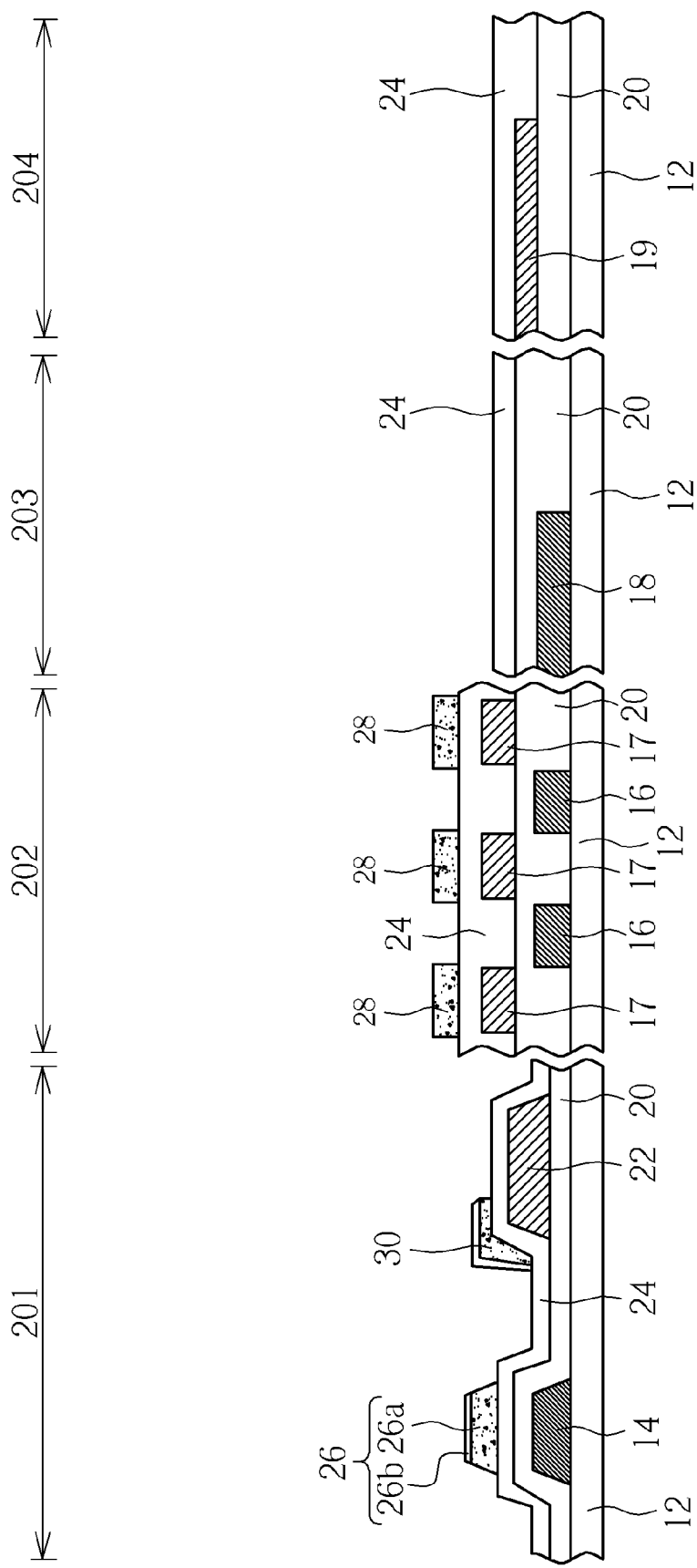

Thereafter, referring to FIG. 10, a second insulation layer 24 is formed to cover the second electrode 22 in the pixel region 201 and the first insulation layer 20 and the wiring traces 17 in the wiring region 102. The second insulation layer 24 and the first insulation layer 20 may together cover the contact pad region 203 and may cover the contact pad region 204, i.e. cover the contact pad 19. Thereafter, a semiconductor layer is formed on the second insulation layer 24. A third PEP is performed to partly remove the semiconductor layer to form a patterned semiconductor layer. The patterned semiconductor layer is allowed to include one portion 26 corresponding to the first electrode 14 and a plurality of portions 28 corresponding to the wiring traces 17. For example, the portion 26 is located right above the first electrode 14 and may serve as a channel. The portions 28 are located right above the wiring traces 17 and each may protect the underlying wiring trace 17 during later processes. The patterned semiconductor layer may be a single layer or a multi-layer, and it may include material such as amorphous silicon, monocrystalline silicon, polycrystalline silicon, microcrystalline silicon, oxide semiconductor material, or other suitable material, or organic semiconductor material. In addition, in other embodiments, the patterned semiconductor layer may be formed through a screen printing process, an ink injection process, or other suitable process. In this embodiment, the portion 26 may include a semiconductor channel layer 26a and a heavily-doped semiconductor layer (or referred to as an ohmic contact layer) 26b. The patterned semiconductor layer may include another portion 30 covering one edge of the second electrode 22 at the side facing the first electrode 14. In other embodiments, the patterned semiconductor layer may include a channel region and a doped region, in which, the channel region is an intrinsic region corresponding to the first electrode 14, and the doped region is a heavily-doped region or a lightly-doped region, or includes both of them.

Figure 11:
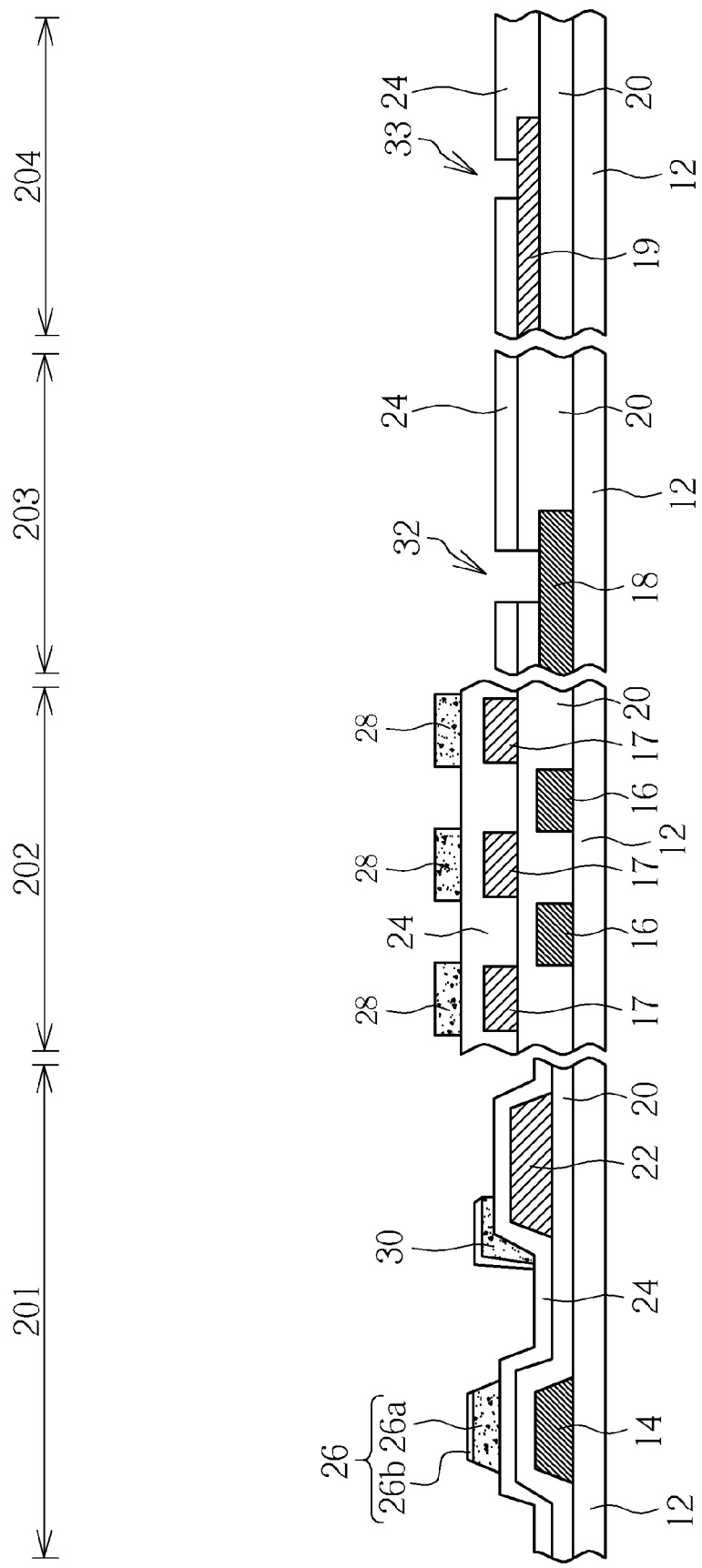

Thereafter, referring to FIG. 11, a fourth PEP is performed to etch the second insulation layer 24 to form an opening 32 within the second insulation layer 24 and the first insulation layer 20 in the contact pad region 203 to expose a portion of the contact pad 18, and to form an opening 33 within the second insulation layer 24 in the contact pad region 204 to expose a portion of the contact pad 19.

Figure 12:
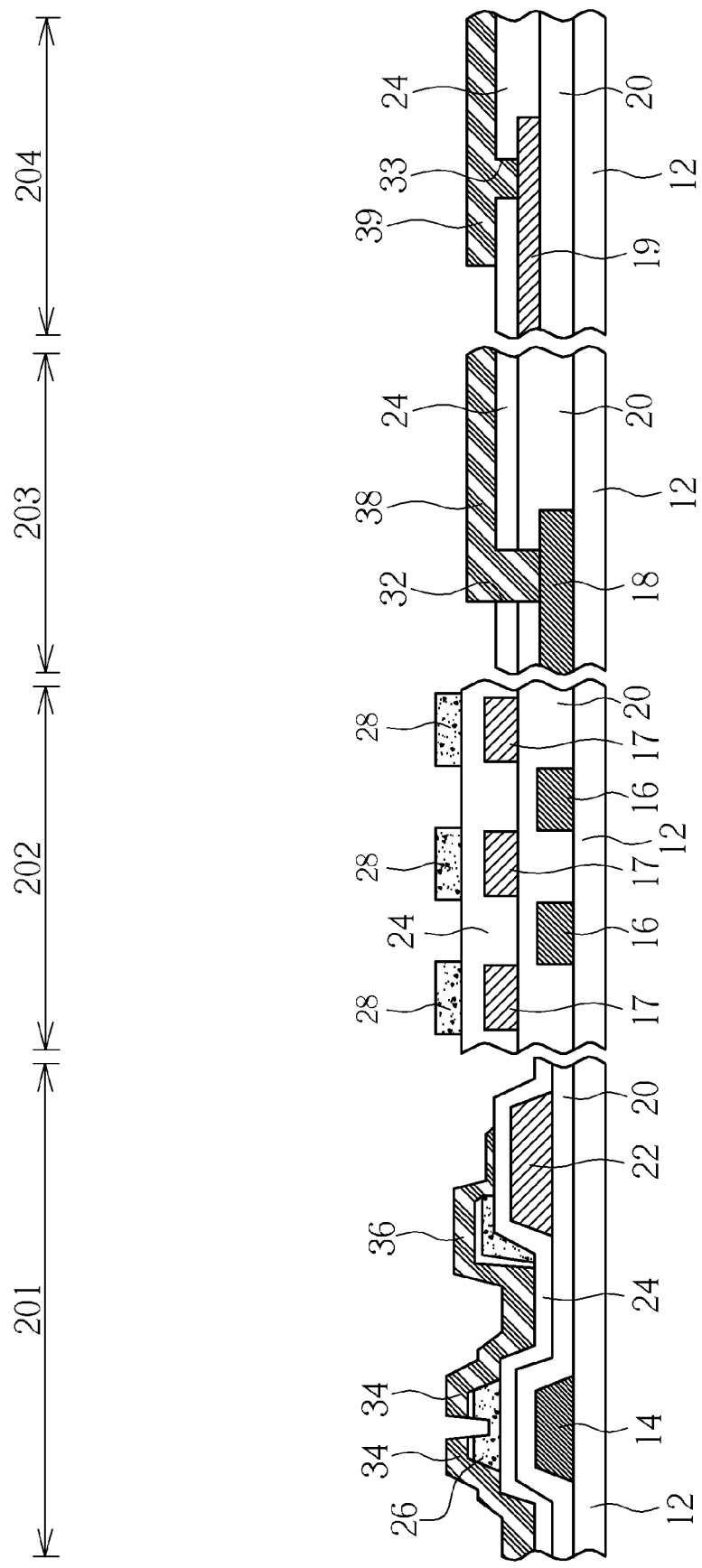

Thereafter, referring to FIG. 12, a third conductive layer is formed on the second insulation layer 24 and the patterned semiconductor layer, fills the opening 32 so as to contact the contact pad 18, and fills the opening 33 so as to contact the contact pad 19. The third conductive layer may be a single layer or a multi-layer. The third conductive layer may include a reflective material or transparent material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The transparent material may include one such as indium tin oxide, indium gallium oxide, indium zinc oxide, aluminum zinc oxide, or other suitable material. Thereafter, a fifth PEP is performed to pattern the third conductive layer to form a third patterned conductive layer, which may include a second electrode line (not shown) in the pixel region 201, a third electrode 34 connected to the second electrode line, and a fourth electrode 36. The third electrode 34, the second electrode line, and the fourth electrode 36 are disposed in the pixel region 201. The first electrode 14, the portion 26 of the patterned semiconductor layer, and the third electrode 34 are made in a way to form a transistor. The fourth electrode 36 and the second electrode 22, which may be, for example, a portion of a storage capacitor line, may be disposed to overlap with each other, with the second insulation layer 24 placed therebetween to form a storage capacitor. In the embodiment as shown in FIG. 12, the third electrode 34 may include a source and a drain apart from each other. This drain may be connected or not connected to the fourth electrode 36. That is, the third electrode 34 and the fourth electrode 36 may be or be not connected to each other. The second electrode line may be connected to the third electrode 34 such as a source, and, accordingly, the second electrode line may be a data line. The third patterned conductive layer may further include a contact pad 38 disposed on the second insulation layer 24 in the contact pad region 203 and a contact pad 39 disposed on the second insulation layer 24 in the contact pad region 204. The contact pads 38 and 39 are connected to the contact pads 18 and 19 through the openings 32 and 33, respectively. In addition, in other embodiments, the third patterned conductive layer may be formed using a process such as a screen printing process, an ink injection process, or other suitable process.

Figure 13:
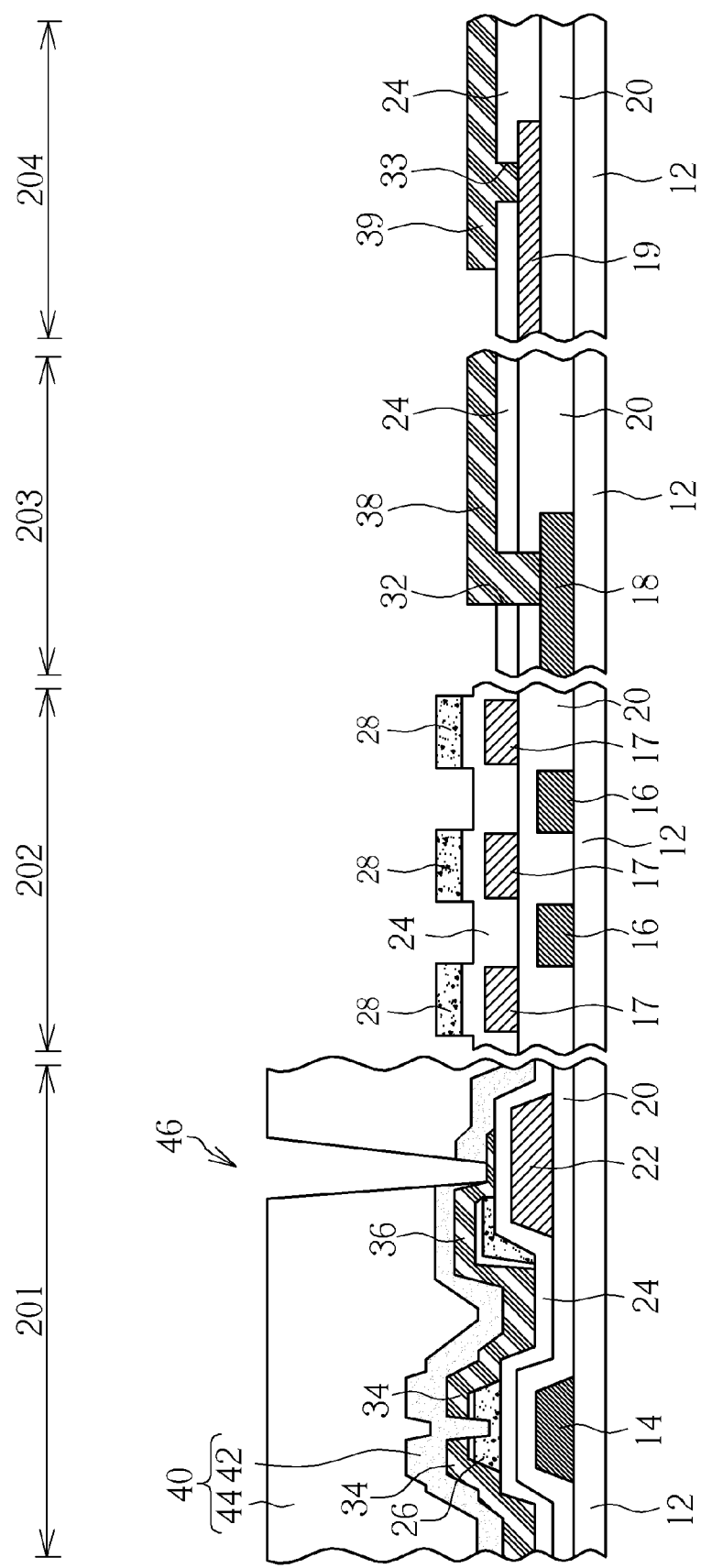

Thereafter, referring to FIG. 13, a protection layer 40 is formed on the second insulation layer 24, the patterned semiconductor layer including the exposed portions 26 and 28, the third electrode 34 and the fourth electrode 36. The protection layer 40 may be formed as follows. First, a passivation layer 42 is formed to cover the third patterned conductive layer or entirely cover the pixel region 201, the wiring region 202, and the contact pad region 203. Thereafter, a photosensitive organic layer 44 is formed to cover the passivation layer 42. The photosensitive organic layer 44 may serve as a planar layer. The passivation layer 42 may include insulation material such as silicon nitride, silicon oxynitride, or silicon oxide. Its thickness may be, for example, about 2000 to about 3000 angstroms. The photosensitive organic layer 44 may include organic material such as photo resist material. Its thickness may be, for example, about 4.2 to about 4.8 micrometers. The stack structure of the passivation layer 42 and the photosensitive organic layer 44 serves as the protection layer 40. Thereafter, a photolithography process is performed to pattern the photosensitive organic layer 44 to form an opening within the photosensitive organic layer 44 to expose portions of the passivation layer 42 above the transistor and the storage capacitor and to remove the photosensitive organic layer 44 in the wiring region 202 and the contact pad regions 203 and 204. Thereafter, the passivation layer 42 in the pixel region 201, the wiring region 202, and contact pad regions 203 and 204 not covered with the photosensitive organic layer 44 is etched to be removed, forming a contact window 46 in the pixel region 201. During the etch process, the portions 28 of the patterned semiconductor layer protect the underlying wiring traces 17 and the second insulation layer 24. In one embodiment, the protection layer 40 only covers the third patterned conductive layer and the second insulation layer 24 in the pixel region 201 subsequently and does not remain in the wiring region 202. In other embodiments, the protection layer 40 may only include the planar photosensitive organic layer 44 or the passivation layer 42.

Figure 14:
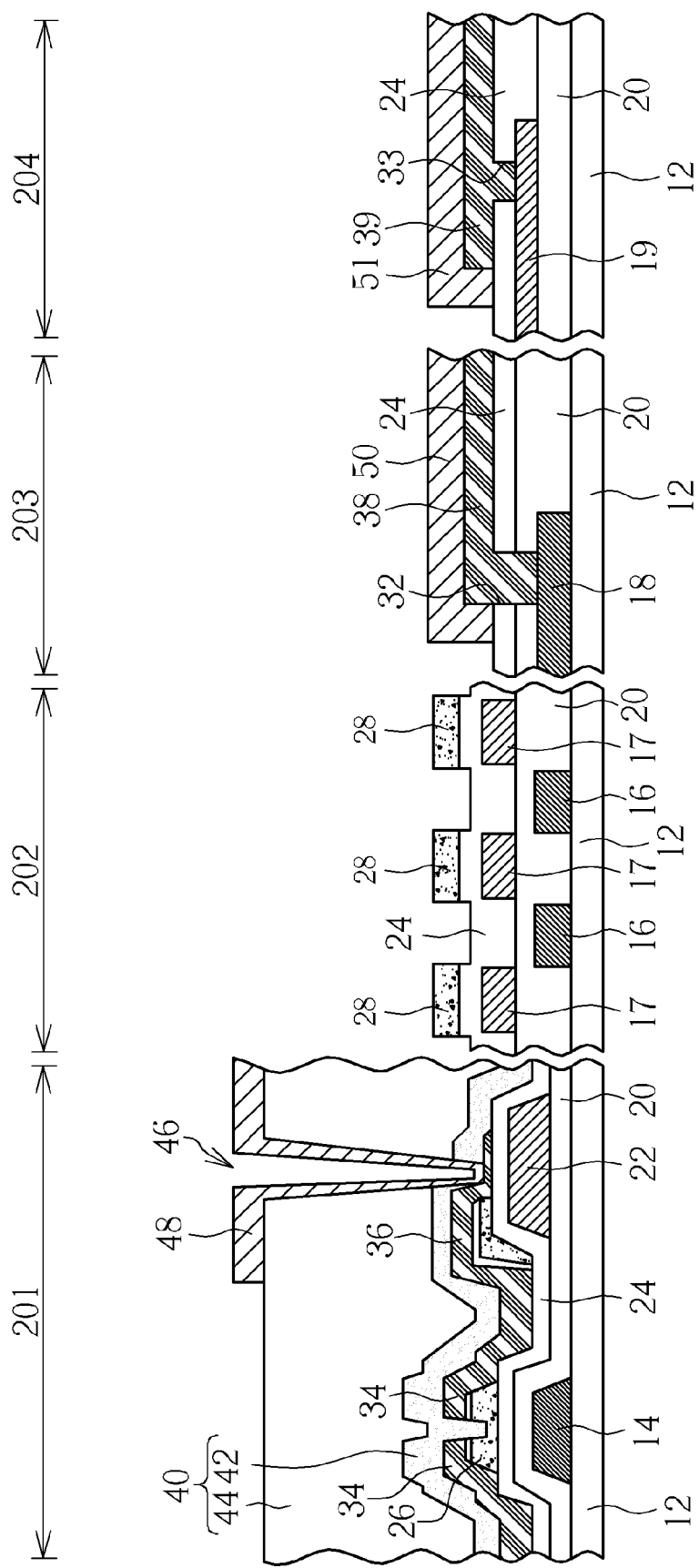

Thereafter, referring to FIG. 14, a conductive film is formed in the pixel region 201, the wiring region 202 and the contact pad regions 203 and 204. The conductive film may be a single layer or a multi-layer and may include transparent material, reflective material, or a combination thereof. The transparent material may include one such as indium tin oxide (ITO), indium zinc oxide (IZO), cadmium tin oxide (CTO), aluminum zinc oxide (AZO), indium tin zinc oxide (ITZO), or other suitable material. The reflective material may include one such as molybdenum, aluminum, titanium, cupper, silver, gold, neodymium, tantalum, tungsten, or other suitable material, an alloy of any combination of the above, or an oxide, nitride or oxynitride of any combination of the above. The thickness of the conductive film may be, for example, about 750 angstroms. A seventh PEP is performed to form a patterned conductive film, which may include a pixel electrode 48 disposed above the protection layer 40 and a portion 50 in the contact pad region 103 apart from the pixel electrode 48. The portion 50 covers the contact pad 38 and may protect the contact pad 38. In FIG. 14, the patterned conductive film is not disposed on the wiring traces 16 and 17. A portion 51 apart from both the pixel electrode 48 and the portion 50 may be further disposed in the contact pad region 204. The portion 51 covers the contact pad 39 and may protect the contact pad 39. The pixel electrode 48 is also formed on the sidewall and the bottom of the contact window 46 and contacts the fourth electrode 36 to be electrically connected to each other. In other embodiments, the patterned conductive film may be formed using a process such as a screen printing process, an ink injection process, or other suitable process.

Figure 15:
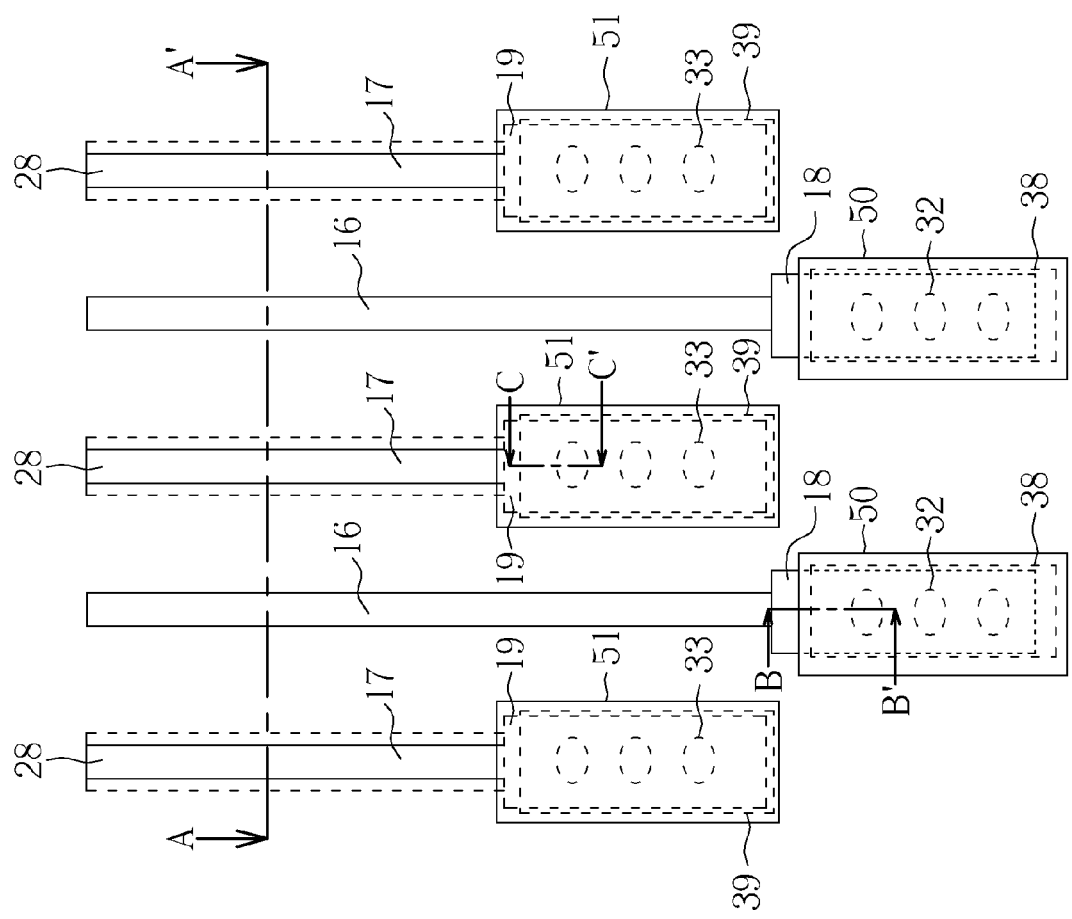
FIG. 15 is a schematic plan view illustrating from a wiring region to a contact pad region in a panel according to another exemplary embodiment of the disclosure.

FIG. 15 is a schematic plan view illustrating a panel from a wiring region 202 to contact pad regions 203 and 204 according to the exemplary embodiment of the disclosure illustrated by FIGS. 8-14. The schematic cross-sectional views for the wiring region 202 shown in FIGS. 8-14 are taken along line AA' as shown in FIG. 15. The schematic cross-sectional views for the contact pad region 203 and 204 shown in FIGS. 8-14 are taken along line BB' and line CC' as shown in FIG. 15.

Figure 16:
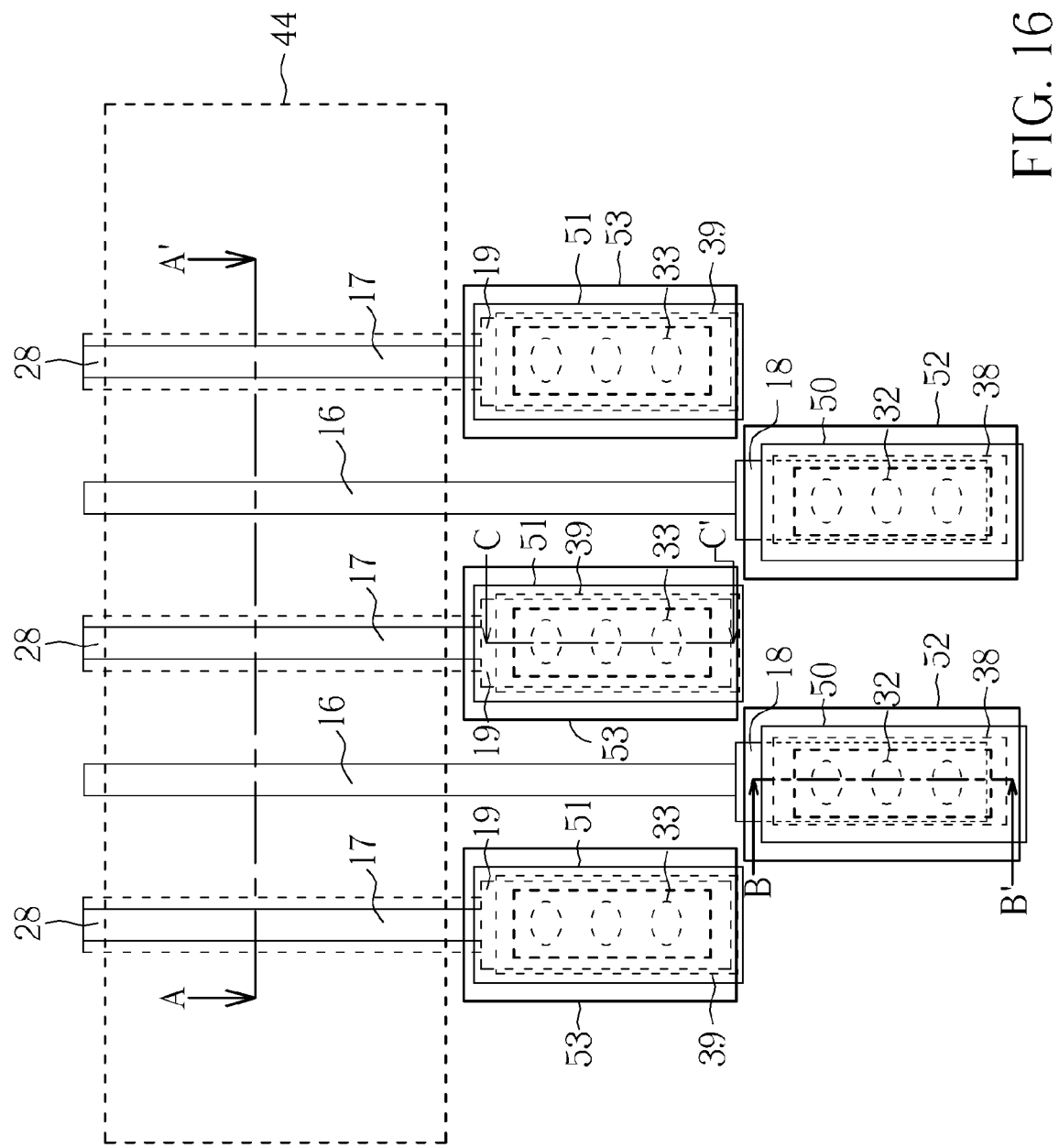
FIG. 16 is a schematic plan view illustrating from a wiring region to a contact pad region in a panel according to further another exemplary embodiment of the disclosure.
Figure 17:
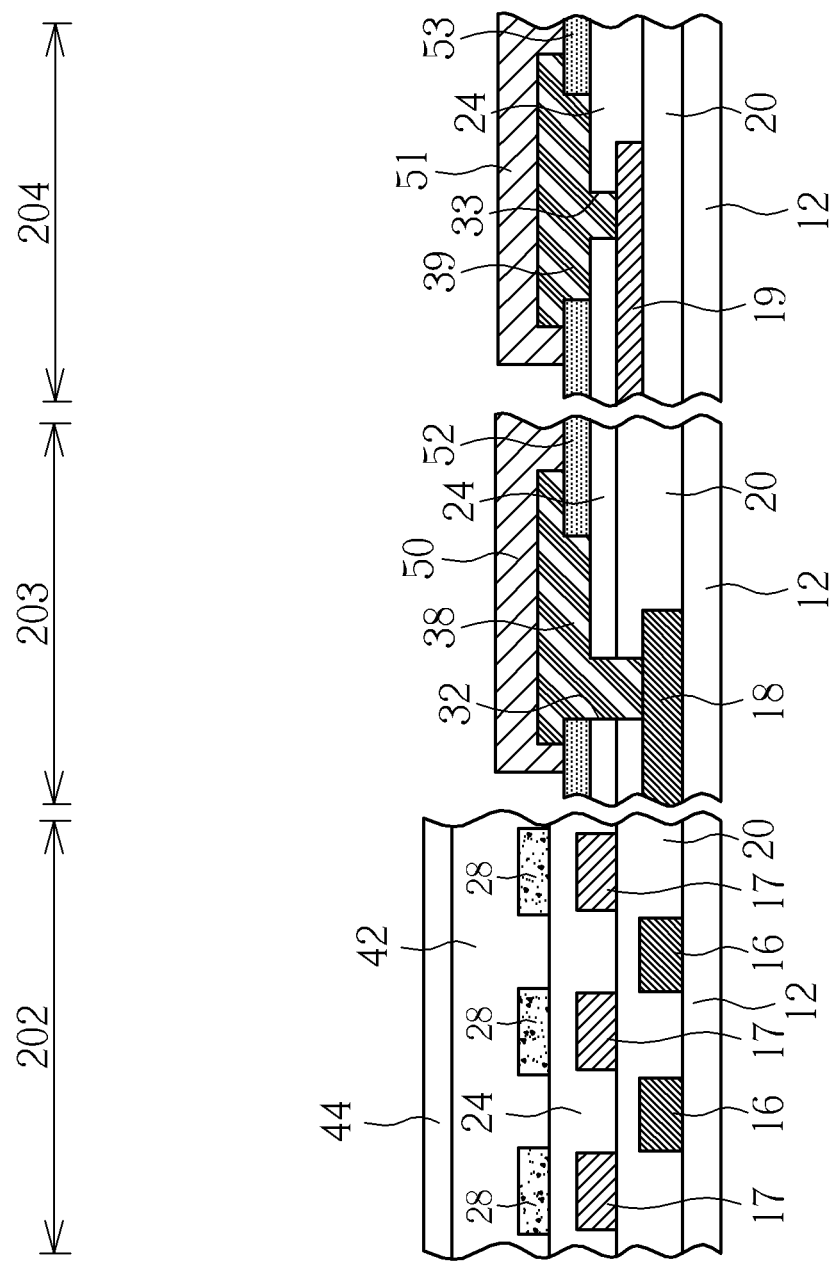
FIG. 17 is a schematic cross-sectional view taken along lines AA', BB' and CC' shown in FIG. 16.

The method of fabricating a panel according to further another exemplary embodiment of the disclosure can be illustrated by FIGS. 16 and 17. FIG. 16 is a schematic plan view. FIG. 17 is a schematic cross-sectional view taken along lines AA', BB', and CC' shown in FIG. 16. Each contact pad shown in FIG. 16 has a plurality of openings, such as three openings, but not limited thereto. Only one opening is shown in each of the cross-sectional views taken along the lines BB' and CC' for concise and easy understanding. In this exemplary embodiment similar to the aforesaid exemplary embodiment illustrated by FIGS. 8-14, the protection layer 40 in the wiring region 202 is not completely removed, but remains a thickness less than the thickness of the portion in the pixel region 201. For example, the photosensitive organic layer 44 in the wiring region 202 is subject to a halftone exposure process to have a remaining thickness thinner than an original thickness. Thus, the wiring traces 16 and 17 can be protected more by the remaining protection layer 40 in addition to the protection of the wiring traces 17 by the patterned semiconductor layer in later processes. Furthermore, in this exemplary embodiment, in addition to the formation of the third electrode, the fourth electrode, and the plurality of portions 28, ring structures 52 and 53 corresponding to the peripheral shapes of the contact pads 38 and 39 in the contact pad regions 203 and 204 may be further formed through patterning of the semiconductor layer. In this exemplary embodiment, the ring structures 52 and 53 are rectangular, and the third conductive layer fills openings of the ring structures 52 and 53 and the openings 32 and 33 to cover or partially cover the ring structures 52 and 53. When the third conductive layer is etched to form the contact pads 38 and 39, the ring structures 52 and 53 formed of the patterned semiconductor layer may protect the border between the third conductive layer and the underlying insulation layer, to avoid or alleviate undercut phenomena between the wiring trace and the insulation layer. The ring structure is not limited to the rectangular shape and it can be in a polygon, curve, or other suitable shape.

In the aforesaid exemplary embodiment, the first electrode 14 serving as a gate, two third electrodes 34 serving as a source and a drain, and the portion 26 of the patterned semiconductor layer are made in a way to form a bottom-gate-type transistor. However, in other embodiments, it is also applicable to a top-gate-type transistor including two first electrodes 14 serving as a source and a drain, one third electrode 34 serving as a gate, and the portion 26 of the patterned semiconductor layer, or an altered bottom-gate-type transistor including the portion 26 of the patterned semiconductor layer formed above two third electrodes 34 serving as a source and a drain.

Furthermore, in the aforesaid exemplary embodiment, it is preferred that the protection layer 40 is not located in the contact pad region, so that the contact pads 18 and 19 in the contact pad regions 103, 203, and 204 can be easily connected to other elements such as chips, circuit board, or other suitable elements.

The panel according to the disclosure may be applied to non-self-luminescent display panel, such as polymer-stabilized alignment (PSA) display panel, electronic paper display panel (EPD), blue phase display panel, dual-view display panel, triple-view display panel, three-dimensional display panel, fringe field switching (FFS) display panel, in-plane switching (IPS) display panel, electrowetting display panel (EWD), multi-domain vertical alignment (MVA) display panel, pattern vertical alignment (PVA) display panel, and any of the aforesaid display panel having a color filter on array (COA) structure or an array on color filter (AOC) structure, self-luminescent display panel, such as organic electro-luminescence panel, inorganic electro-luminescence panel, a combination thereof, or other suitable panels, other suitable panel, or a combination thereof. All of the aforesaid panels each may be incorporated with a function such as touch function, solar cell usable function, photo detection function, or other functions.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A panel, comprising:
a substrate defined with a pixel region and a wiring region on at least one side of the pixel region;
a first patterned conductive layer disposed on the substrate, wherein the first patterned conductive layer comprises at least one first electrode line, at least one first electrode, and at least one wiring trace, the first electrode and the first electrode line are connected to each other and both disposed in the pixel region, and the wiring trace is disposed in the wiring region;
a first insulation layer disposed to cover the pixel region, the wiring region, and the first patterned conductive layer;
a second patterned conductive layer disposed on the first insulation layer, the second patterned conductive layer comprising at least one second electrode disposed on the first insulation layer in the pixel region;
a second insulation layer disposed to cover the second electrode in the pixel region, the wiring region, and the first insulation layer above the wiring trace;
a patterned semiconductor layer disposed on the second insulation layer, the patterned semiconductor layer comprising at least one first portion corresponding to the first electrode and at least one second portion corresponding to the wiring trace;
a third patterned conductive layer disposed on the second insulation layer, the third patterned conductive layer comprising at least one second electrode line, at least one third electrode connected to the second electrode line, and at least one fourth electrode, wherein the third electrode, the second electrode line, and the fourth electrode are disposed in the pixel region, the first electrode, the first portion of the patterned semiconductor layer, and the third electrode are disposed to form a transistor, and the fourth electrode and the second electrode are correspondingly disposed to form a storage capacitor;
a protection layer disposed to cover the third patterned conductive layer and the second insulation layer in the pixel region; and
a patterned conductive film disposed on the protection layer in the pixel region, the patterned conductive film comprising at least one pixel electrode connected to the transistor and the storage capacitor.

2. The panel according to claim 1, wherein the wiring trace is connected to the first electrode line or the second electrode line.

3. The panel according to claim 1, wherein
the substrate further comprises a contact pad region;
the first patterned conductive layer further comprises at least one first contact pad disposed on the contact pad region and the first contact pad is connected to the wiring trace;
the second insulation layer further disposed on the contact pad region;
the third patterned conductive layer further comprises at least one second contact pad disposed on the second insulation layer in the contact pad region, the at least one second contact pad connected to the first contact pad through an opening in the second insulation layer; and
the patterned conductive film further comprises at least one third portion apart from the pixel electrode, the third portion disposed to cover the second contact pad, wherein the patterned semiconductor layer is not in the contact pad region.

4. A panel, comprising:
a substrate defined with a pixel region and a wiring region on at least one side of the pixel region;
a first patterned conductive layer disposed on the substrate, wherein the first patterned conductive layer comprises at least one first electrode line, at least one first electrode connected to the first electrode line, and at least one first wiring trace, the first electrode and the first electrode line are in the pixel region, and the at least one first wiring trace is in the wiring region;

a first insulation layer disposed to cover the pixel region, the wiring region, and the first patterned conductive layer;

a second patterned conductive layer disposed on the first insulation layer, the second patterned conductive layer comprising at least one second electrode disposed on the first insulation layer in the pixel region and at least one second wiring trace in the wiring region;

a second insulation layer disposed to cover the second electrode in the pixel region, the wiring region, the first insulation layer above the first wiring trace, and the second wiring trace;

a patterned semiconductor layer disposed on the second insulation layer, the patterned semiconductor layer comprising at least one first portion corresponding to the first electrode and at least one second portion corresponding to the second wiring trace;

a third patterned conductive layer disposed on the second insulation layer, wherein, the third patterned conductive layer comprises at least one second electrode line, at least one third electrode connected to the second electrode line, and at least one fourth electrode, wherein the third electrode, the second electrode line, and the fourth electrode are in the pixel region, the first electrode, the first portion of the patterned semiconductor layer and the third electrode are disposed to form a transistor, and the fourth electrode and the second electrode are correspondingly disposed to form a storage capacitor;

a protection layer disposed to cover the third patterned conductive layer and the second insulation layer in the pixel region; and a patterned conductive film disposed on the protection layer in the pixel region, and the patterned conductive film comprising at least one pixel electrode connected to the transistor and the storage capacitor.

5. The panel according to claim 4, wherein the protection layer further covers the second portion of the patterned semiconductor layer in the wiring region and the second insulation layer in the wiring region, the protection layer in the pixel region has a first thickness, the protection layer in the wiring region has a second thickness, and the first thickness is substantially greater than the second thickness.

6. The panel according to claim 4, wherein the patterned semiconductor layer further comprises at least one third portion disposed on the second insulation layer corresponding to the first wiring trace.

7. The panel according to claim 4, wherein
the substrate further comprises a contact pad region;
the first patterned conductive layer further comprises at least one first contact pad disposed in the contact pad region;
the second patterned conductive layer further comprises at least one second contact pad disposed in the contact pad region;
the second insulation layer is further disposed in the contact pad region;
the third patterned conductive layer further comprises at least one third contact pad and at least one fourth contact pad, the third contact pad disposed in the contact pad region and connected to the first contact pad through a first opening in the second insulation layer, the fourth contact pad disposed in the contact pad region and connected to the second contact pad through a second opening in the second insulation layer; and
the patterned conductive film further comprises at least one third portion and at least one fourth portion, the third portion disposed to cover the third contact pad, the fourth portion disposed to cover the fourth contact pad, and the pixel electrode, the third portion and the fourth portion being apart from each other.

8. The panel according to claim 5, wherein,
the substrate further comprises a contact pad region;
the first patterned conductive layer further comprises at least one first contact pad disposed in the contact pad region;
the second patterned conductive layer further comprises at least one second contact pad disposed in the contact pad region;
the second insulation layer is further disposed in the contact pad region;
the patterned semiconductor layer is further disposed on the second insulation layer in the contact pad region to form a first ring structure and a second ring structure;
the third patterned conductive layer further comprises at least one third contact pad and at least one fourth contact pad, the third contact pad disposed in the contact pad region and connected to the first contact pad through a first opening in the first ring structure and in the second insulation layer, the fourth contact pad disposed in the contact pad region and connected to the second contact pad through a second opening in the second ring structure and in the second insulation layer; and
the patterned conductive film further comprises at least one third portion and at least one fourth portion, the third portion disposed to cover the third contact pad, the fourth portion disposed to cover the fourth contact pad, and the pixel electrode, the third portion and the fourth portion being apart from each other.

9. A method of fabricating a panel, comprising:
providing a substrate defined with a pixel region and a wiring region on at least one side of the pixel region;
forming a first patterned conductive layer on the substrate, wherein the first patterned conductive layer comprises at least one first electrode line, a first electrode connected to the at least one first electrode line, and at least one wiring trace, the first electrode and the first electrode line are disposed in the pixel region, and the wiring trace is disposed in the wiring region;
forming a first insulation layer covering the pixel region, the wiring region, and the first patterned conductive layer;
forming a second patterned conductive layer on the first insulation layer, the second patterned conductive layer comprising at least one second electrode disposed on the first insulation layer in the pixel region;
forming a second insulation layer covering the second electrode in the pixel region, the wiring region, and the first insulation layer above the wiring trace;
forming a patterned semiconductor layer on the second insulation layer, the patterned semiconductor layer comprising at least one first portion corresponding to the first electrode and at least one second portion corresponding to the wiring trace;
forming a third patterned conductive layer disposed on the second insulation layer, the third patterned conductive layer comprising at least one second electrode line, at least one third electrode connected to the second electrode line, and at least one fourth electrode, wherein the third electrode, the second electrode line, and the fourth electrode are disposed in the pixel region, the first electrode, the first portion of the patterned semiconductor layer, and the third electrode are disposed to form a transistor, and the fourth electrode and the second electrode are correspondingly disposed to form a storage capacitor;

forming a protection layer covering the third patterned conductive layer and the second insulation layer in the pixel region; and forming a patterned conductive film on the protection layer in the pixel region, the patterned conductive film comprising at least one pixel electrode connected to the transistor and the storage capacitor.

10. The method of fabricating the panel according to claim 9, wherein the substrate further comprises a contact pad region;

the first patterned conductive layer further comprises at least one first contact pad disposed on the contact pad region;

the third patterned conductive layer further comprises at least one second contact pad disposed on the contact pad region and connected to the first contact pad through an opening in the second insulation layer; and the patterned conductive film further comprises at least one third portion apart from the pixel electrode, the third portion disposed to cover the second contact pad, wherein the patterned semiconductor layer is not in the contact pad region.

11. The method of fabricating the panel according to claim 9, wherein the wiring trace is connected to the first electrode line or the second electrode line.

12. The method of fabricating the panel according to claim 9, wherein steps of forming the protection layer covering the third patterned conductive layer and the second insulation layer in the pixel region and forming the patterned conductive film on the protection layer in the pixel region, the patterned conductive film comprising the at least one pixel electrode connected to the transistor and the storage capacitor, comprise:

forming a passivation layer on the third patterned conductive layer;

forming a photosensitive organic layer on the passivation layer, wherein the passivation layer and the photosensitive organic layer are adapted to formed a stack structure as the protection layer;

performing a photolithography process on the photosensitive organic layer to expose two portions of the passivation layer located above the transistor and the storage capacitor respectively;

performing an etch process to remove the passivation layer not covered with the photosensitive organic layer to form a contact window exposing a portion of the storage capacitor and to allow the protection layer to only cover the third patterned conductive layer and the second insulation layer in the pixel region; and forming the patterned conductive film on the protection layer in the pixel region, the patterned conductive film comprising the pixel electrode connected to the storage capacitor through the contact window.

13. A method of fabricating a panel, comprising:

providing a substrate defined with a pixel region and a wiring region on at least one side of the pixel region;

forming a first patterned conductive layer disposed on the substrate, wherein the first patterned conductive layer comprises at least one first electrode line, at least one first electrode connected to the first electrode line, and at least one first wiring trace, wherein the first electrode and the first electrode line are in the pixel region, and the at least one first wiring trace is in the wiring region;

forming a first insulation layer covering the pixel region, the wiring region, and the first patterned conductive layer;

forming a second patterned conductive layer on the first insulation layer, the second patterned conductive layer comprising at least one second electrode disposed on the first insulation layer in the pixel region and at least one second wiring trace in the wiring region;

forming a second insulation layer covering the second electrode in the pixel region, the wiring region, the first insulation layer above the first wiring trace, and the second wiring trace;

forming a patterned semiconductor layer on the second insulation layer, the patterned semiconductor layer comprising at least one first portion corresponding to the first electrode and at least one second portion corresponding to the second wiring trace;

forming a third patterned conductive layer on the second insulation layer, wherein the third patterned conductive layer comprises at least one second electrode line, at least one third electrode connected to the second electrode line, and at least one fourth electrode, wherein the third electrode, the second electrode line, and the fourth electrode are in the pixel region, the first electrode, the first portion of the patterned semiconductor layer and the third electrode are disposed to form a transistor, and the fourth electrode and the second electrode are correspondingly disposed to form a storage capacitor;

forming a protection layer covering the third patterned conductive layer and the second insulation layer in the pixel region; and forming a patterned conductive film disposed on the protection layer in the pixel region, and the patterned conductive film comprising at least one pixel electrode connected to the transistor and the storage capacitor.

14. The method of fabricating the panel according to claim 13, wherein the protection layer is disposed to further cover the second portion of the patterned semiconductor layer in the wiring region and the second insulation layer in the wiring region, the protection layer in the pixel region has a first thickness, the protection layer in the wiring region has a second thickness, and the first thickness is substantially greater than the second thickness.

15. The method of fabricating the panel according to claim 13, wherein the patterned semiconductor layer further comprises at least one third portion disposed on the second insulation layer corresponding to the first wiring trace.

16. The method of fabricating the panel according to claim 13, wherein the substrate further comprises a contact pad region;

the first patterned conductive layer further comprises one first contact pad disposed in the contact pad region;

the second patterned conductive layer further comprises one second contact pad disposed in the contact pad region;

the third patterned conductive layer further comprises a third contact pad and a fourth contact pad, the third contact pad disposed in the contact pad region and connected to the first contact pad through a first opening in the second insulation layer, the fourth contact pad disposed in the contact pad region and connected to the second contact pad through a second opening in the second insulation layer; and the patterned conductive film further comprises a third portion and a fourth portion, the third portion disposed to cover the third contact pad, the fourth portion disposed to cover the fourth contact pad, and the pixel electrode, the third portion and the fourth portion being apart from each other.

17. The method of fabricating the panel according to claim 14, wherein
the substrate further comprises a contact pad region;
the first patterned conductive layer further comprises at least one first contact pad disposed in the contact pad region;
the second patterned conductive layer further comprises at least one second contact pad disposed in the contact pad region;
the second insulation layer is further disposed on the contact pad region;
the patterned semiconductor layer is further disposed on the second insulation layer in the contact pad region to form a first ring structure and a second ring structure;
the third patterned conductive layer further comprises at least one third contact pad and at least one fourth contact pad, the third contact pad disposed in the contact pad region and connected to the first contact pad through a first opening in the second insulation layer and the first ring structure, the fourth contact pad disposed in the contact pad region and connected to the second contact pad through a second opening in the second insulation layer and the second ring structure; and
the patterned conductive film further comprises at least one third portion and at least one fourth portion, the third portion disposed to cover the third contact pad, the fourth portion disposed to cover the fourth contact pad, and the pixel electrode, the third portion and the fourth portion being apart from each other.

18. The method of fabricating the panel according to claim 13, wherein steps of forming the protection layer covering the third patterned conductive layer and the second insulation layer in the pixel region and forming the patterned conductive film on the protection layer in the pixel region, the patterned conductive film comprising the at least one pixel electrode connected to the transistor and the storage capacitor, comprise:
forming a passivation layer on the third patterned conductive layer;
forming a photosensitive organic layer on the passivation layer, wherein the passivation layer and the photosensitive organic layer are adapted to formed a stack structure as the protection layer;
performing a photolithography process on the photosensitive organic layer to expose two portions of the passivation layer located above the transistor and the storage capacitor respectively;
performing an etch process to remove the passivation layer not covered with the photosensitive organic layer to form a contact window exposing a portion of the storage capacitor; and
forming the patterned conductive film on the protection layer in the pixel region, the patterned conductive film comprising the pixel electrode connected to the storage capacitor through the contact window.

* * * * *